US008610432B2

(12) United States Patent
Shigeta et al.

(10) Patent No.: US 8,610,432 B2
(45) Date of Patent: Dec. 17, 2013

(54) PROPELLER/BLADE MRI WITH NON-LINEAR MAPPING TO K-SPACE

(75) Inventors: Takashi Shigeta, Tochigi-ken (JP); Masao Yui, Tochigi-ken (JP)

(73) Assignees: Kabushiki Kaisha Toshiba, Minato-Ku, Tokyo (JP); Toshiba Medical Systems Corporation, Otawara-Shi, Tochigi-Ken (JP)

( * ) Notice: Subject to any disclaimer, the term of this patent is extended or adjusted under 35 U.S.C. 154(b) by 314 days.

(21) Appl. No.: 13/010,001

(22) Filed: Jan. 20, 2011

(65) Prior Publication Data

US 2011/0175613 A1    Jul. 21, 2011

(30) Foreign Application Priority Data

Jan. 21, 2010  (JP) ................................. 2010-011047
Jan. 19, 2011  (JP) ................................. 2011-008989

(51) Int. Cl.
    *G01V 3/00*    (2006.01)
(52) U.S. Cl.
    USPC ........................................... 324/309; 324/307
(58) Field of Classification Search
    USPC .................................. 324/309, 307, 314, 318
    See application file for complete search history.

(56) References Cited

U.S. PATENT DOCUMENTS

| 7,102,348 | B2 * | 9/2006 | Zhang et al. | 324/309 |
| 7,245,125 | B2 * | 7/2007 | Harer et al. | 324/310 |
| 7,265,547 | B2 * | 9/2007 | Vu | 324/309 |
| 7,535,222 | B2 * | 5/2009 | Bammer et al. | 324/307 |
| 7,649,354 | B2 * | 1/2010 | Bayram et al. | 324/309 |
| 7,941,204 | B1 * | 5/2011 | Wang et al. | 600/420 |
| 8,022,700 | B2 * | 9/2011 | Nimbargi et al. | 324/309 |

FOREIGN PATENT DOCUMENTS

WO    2008/132659    11/2008

OTHER PUBLICATIONS

James G. Pipe, "Motion Correction With Propeller MRI: Application to Head Motion and Free-Breathing Cardiac Imaging," Magnetic Resonance in Medicine 42:963-969 (1999).

S. Skare et al., "A new propeller EPI design using short axis readouts" Proc. Intl. Soc. Mag. Reson. Med. 14 (2006), p. 854.

* cited by examiner

*Primary Examiner* — Louis Arana

(74) *Attorney, Agent, or Firm* — Nixon & Vanderhye PC

(57) ABSTRACT

A magnetic resonance imaging apparatus and method acquires NMR signal data for a periodically rotated data acquisition region in k-space wherein the acquisition region is caused to have non-linear acquisition loci. As an example, the width of the data acquisition region at a point distant from the origin of k-space is made larger than at a point nearer the origin of k-space thereby more fully filling k-space with acquired NMR data even if the number of RF pulse shots is reduced and/or the number of data acquisition region positions is reduce. A magnetic resonance image is reconstructed based on the acquired NMR signal data in k-space.

24 Claims, 14 Drawing Sheets

PROPELLER/BLADE MRI WITH NON-LINEAR MAPPING TO K-SPACE

CROSS-REFERENCE TO RELATED APPLICATIONS

This application is based upon and claims the benefit of priority under 35 U.S.C. §119 from Japanese Patent Application No. 2010-11047, filed Jan. 21, 2010 and from Japanese Patent Application No. 2011-8989 filed Jan. 19, 2011, the entire contents of both of which are hereby incorporated by reference.

TECHNICAL FIELD

Exemplary embodiments described herein relate generally to method and apparatus for magnetic resonance imaging (MRI)—and more particularly to rotating propeller/blade nuclear magnetic resonance (NMR) data acquisition techniques.

BACKGROUND

MRI methods and apparatus of numerous commercially available designs are by now well known. MRI utilizes nuclear magnetic resonance (NMR) phenomena to provide displayed images of internal patient anatomy. The anatomy to be imaged is subjected to a strong static magnetic field to generally align therewith the magnetic moments of a significant number of one or more nuclear species (e.g., hydrogen atoms in water molecules). An RF (radio frequency) magnetic field (at the NMR Larmor frequency) is radiated into the anatomy to be imaged so as to nutate these aligned magnetic moments from the static field by a desired amount. Then, the initial nutating RF field is turned off and a characteristic RF NMR response is then generated as the nutated nuclei move back toward alignment with the static field. A sequence of controlled pulses of magnetic gradient fields (i.e., still aligned in direction with the static field but now having respective magnitudes that exhibit separate and controllable spatial gradients along each of three orthogonal coordinate directions) and/or further RF nutation pulses are applied to the subject anatomy to elicit detectable NMR RF responses from these nuclei that now have encoded spatial information (e.g., vis-a-vis relative magnitudes, frequencies and/or phases of the detected RF NMR response signals). The detected/decoded RF NMR time-domain responses are then used to populate k-space, the k-space data then being subjected to multi-dimensional Fourier Transformation (FT) so as to generate spatial domain image data for output (e.g., to a display, to storage, to a remote location for display or storage, etc).

However if the patient anatomy being imaged moves during the data acquisition period, motion artifacts are generated in the resulting displayed image. Such motion artifacts may cause difficulties of various kinds if the image is used for medical diagnosis purposes.

One prior approach for reducing motion artifact (e.g., correcting for such) is commonly known as PROPELLER (periodically rotated overlapping parallel lines with enhanced reconstruction)—also sometimes called the BLADE method. Sometimes hereinafter such technique may be referred to as a "propeller" or "blade" or "propeller/blade" and/or a "blade rotation" data acquisition method. FIG. 17 and FIG. 18 illustrate some aspects of such prior art propeller/blade techniques.

As FIG. 17 indicates, the blade rotation data acquisition method acquires NMR signal data using non-Cartesian grid filling into k-space. This is achieved by rotating a belt-like or blade-like data acquisition region (herein called a "blade") formed by a plurality of parallel data acquisition loci for which NMR data is acquired at repeated time intervals. Such blade rotation data acquisition can be performed using many different basic and well known NMR data acquisition techniques. For example, one can use the well known FSE (Fast Spin Echo) method which can employ multi shot MRI techniques. Once NMR data for a given position of the blade has been acquired, the blade angle can be rotated around the origin the k-space (e.g., by altering the relative magnitudes of simultaneously applied orthogonal gradient magnetic fields to create a vector sum gradient field for use in further periodically repeated NMR data acquisition sequences within the now rotated blade position). In such blade rotation data acquisition methods, the direction along the longer side of the blade area is used as the read-out (RO) direction and the direction along the shorter side of the blade is used as the phase encode (PE) direction as shown by FIG. 17.

As FIG. 17 indicates, data near the origin of k-space (i.e., low spatial frequency data) exists on every blade. Therefore, comparison between different time-spaced images made by Fourier Transformation of acquired k-space data on respectively corresponding blades enables determination of possible motion-induced displacement of common imaged elements between the repeatedly imaged low spatial frequency region near the origin of k-space.

Then, on the basis of such determined image element displacements, if any, discrepancies between the repeatedly imaged elements (albeit at different respective times) are corrected by well known image rotation and/or translation techniques to produce (and by inverse multi-dimensional FT to go from the spatial domain back to k-space and produce a correspondingly corrected k-space data set) MR images for display (now again using multi-dimensional FT to go from k-space to the spatial domain) having suppressed motion artifact.

As noted, it is common in the blade rotation data acquisition method to use the direction along the longer side of the blade as the read-out (RO). However there are some cases where this blade rotation data correction process can undesirably increase phase errors caused by a non-uniform static magnetic field. To help alleviate this possible problem, another species of blade data acquisition method (Short Axis PROPELLER) can be used. As shown in FIG. 18, an EPI (Echo Planar Imaging) method can be used wherein the direction along the longer side of the blade is used as the phase encode (PE) direction while the direction along the shorter side of the blade is used as the read-out (RO) direction. Of course in this method the blade region is still rotated after repeated time intervals.

DETAILED DESCRIPTION OF EXEMPLARY EMBODIMENTS

In present exemplary embodiments, NMR signal data for k-space is acquired by use of a time-sequence of overlapping data acquisition regions in k-space (e.g., a rectilinear NMR data acquisition region which is sequentially rotated about the origin of k-space). A data acquisition controller is configured to control data acquisition pulse sequence parameters so that at least one dimension (e.g., width) of the data acquisition region increases as distance from origin of k-space increases. An image reconstruction unit is configured to reconstruct a spatial domain MR image based on the acquired k-space data.

Exemplary embodiments are described with reference to the attached drawings.

First Exemplary Embodiment

First, an overall configuration of a typical MRI apparatus will be described. As those in the art will recognize, a conventional MRI apparatus can be configured (e.g., by loading and executing appropriate computer program modules into suitable digital computer program memory) to effect the various functional blocks to be described below and/or special application hardware (e.g., an ASIC (application specific integrated circuit) can be configured to effect the various functional blocks to be described below. The following description of exemplary basic MRI apparatus (i.e., insofar as not yet configured to effect non-linear features characterizing the invention as defined by appended claims) will be understood as a merely a high level simplified description of a non-limiting example.

Figure 1:
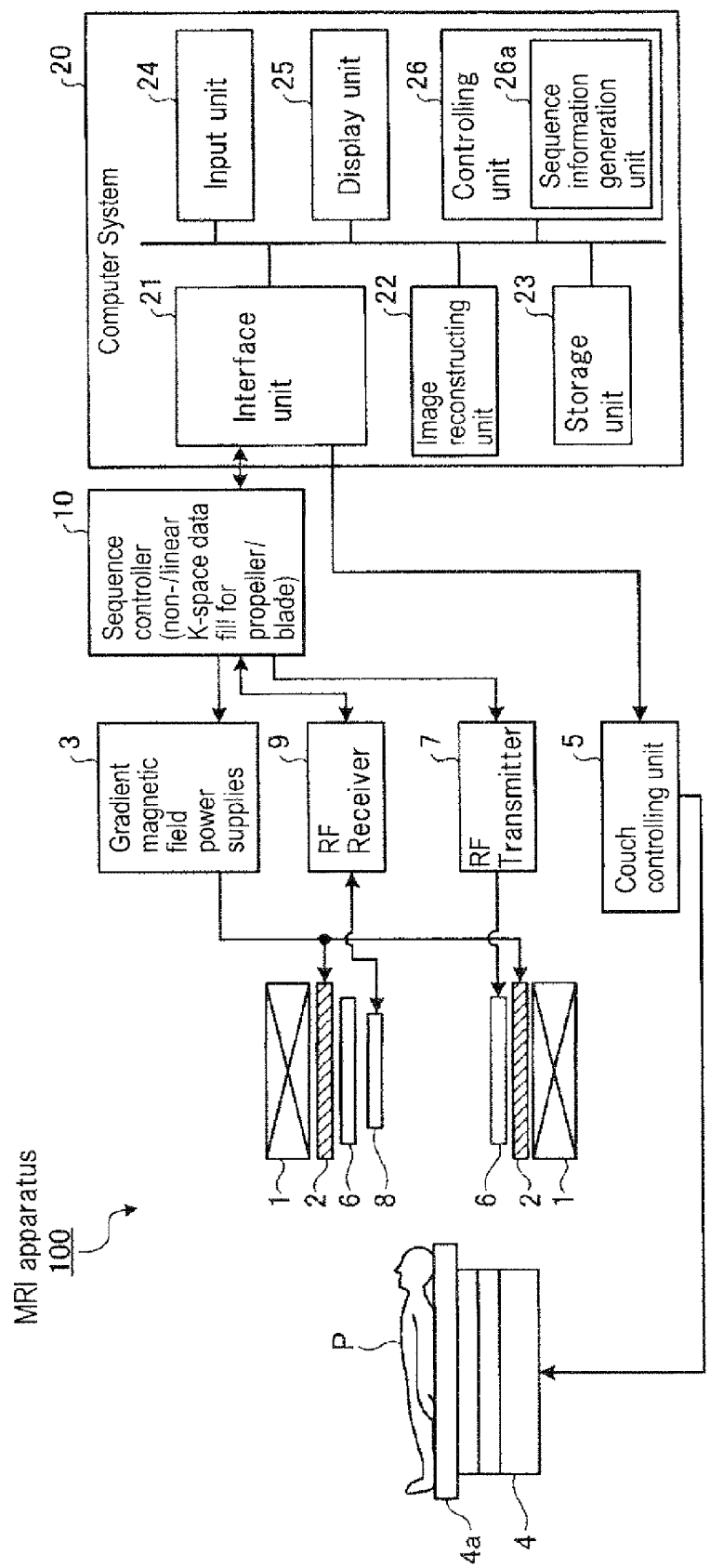
FIG. 1 is a simplified schematic block diagram of a first exemplary MRI apparatus embodiment.

FIG. 1 is a block diagram of MRI apparatus 100 which includes: a static magnetic-field magnet 1, a set of orthogonal gradient magnetic-field coils 2, controllable gradient magnetic-field power supplies 3, patient couch 4, patient couch controller 5, RF transmission coil 6, RF transmitter 7, RF reception coil 8, RF receiver 9, sequence controller 10, and computer system 20.

The static magnetic-field magnet 1 can, for example, comprise a hollow, cylindrical magnet structure that generates a substantially uniform static magnetic field in an imaging volume space within the static magnetic-field magnet 1. The static magnetic-field magnet 1 can include, for example, one or more permanent magnets, a superconductive magnet, and the like.

The set of gradient magnetic-field coils 2 can also comprise hollow, cylindrical coils disposed on an inner side of the static magnetic-field magnet 1. The set of gradient magnetic-field coils 2 may be formed by an assembly of three coils corresponding to each of the usual orthogonal axes, X, Y, and Z (i.e., which axes are each perpendicular to one another). The three coils individually receive an electric current supplied by the gradient magnetic-field power supplies 3, described hereafter, and generate respective gradient magnetic fields of which magnetic field intensities respectively change along the X, Y, and Z axes. By convention, typically the Z-axis direction chosen to be along same direction as the static magnetic-field magnetic field Bo.

The gradient magnetic-field power supplies 3 respectively supply the electric current to the individual gradient magnetic-field coils.

Here, as is typical, the x-axis gradient magnetic field corresponds to the read-out (Gro) direction, the y-axis gradient magnetic field corresponds to the phase-encoding (Gpe) direction and the z-axis gradient magnetic field corresponds to the slice select (Gss) direction. The slice-selection gradient magnetic-field Gss is used to select any arbitrarily desired imaging cross-sectional slice. The phase-encoding direction gradient magnetic-field Gpe is mainly used to change the phase of an NMR response signal as a function of resonant nuclei spatial position (in the y-axis direction). The readout gradient direction magnetic-field Gro is used to change the frequency (i.e., to frequency encode) of an NMR response signal as a function of resonant nuclei spatial position (in the x-axis direction). As will be appreciated, this assignment of conventional orthogonal directions can be changed. For example, in the exemplary embodiments, it should be noted that not only phase encoding but also frequency encoding could be added along the direction conventionally defined as the phase encode direction.

The patient couch 4 includes a top plate 4a on which a patient subject P is placed. Under control of the patient couch controlling unit 5, the top plate 4a is inserted into a cavity (opening to the imaging volume) within the static and gradient magnetic-field coils. Ordinarily, patient couch 4 is set such that a longitudinal direction of the patient couch 4 is parallel with a center axis of the static magnetic-field magnet 1. The patient couch controlling unit 5 controls the patient couch 4. The patient couch controlling unit 5, under control of controlling unit 26, described hereafter, drives the patient couch 4 and can move the top plate 4a in both the longitudinal and vertical directions.

RF transmission coil 6 is disposed within the gradient magnetic-field coils. The RF transmission coil 6 receives a high-frequency (RF) pulse from transmitter 7 and generates a high-frequency (RF) magnetic field.

The RF transmitter 7 transmits the high-frequency RF pulse corresponding to the Larmor frequency of a desired nuclei species via RF transmission coil 6.

The RF reception coil 8 is also disposed within the gradient magnetic-field coils. The RF reception coil 8 receives a NMR RF response signal emanating from the subject P as induced to occur by the transmitted RF pulse (and likely a sequence of RF and gradient magnetic field pulses). Upon receiving the NMR RF signal, the RF reception coil 8 outputs the received NMR signal to RF receiver 9.

Receiver 9 generates detected NMR data for k-space based on the RF NMR signal outputted from RF reception coil 8. For example, receiver 9 typically may include a selector, a pre-amplifier, a phase detector and an analog-digital converter. The selector selectively inputs NMR signals outputted from RF reception coil 8. The pre-amplifier amplifies the NMR signal outputted from the selector. The phase detector detects a relative phase (e.g., compared to the transmitted RF pulse) of the NMR signals outputted from the pre-amplifier. The analog-digital converter generates digitized data NMR signal values by converting the outputted phase and frequency encoded signal from the phase detector into corresponding digital data signals for phase/frequency sites in k-space.

The sequence controller 10 drives gradient magnetic-field power supplies 3, RF transmitter 7, and receiver 9 based on data acquisition sequence information supplied by the computer system 20, thereby effecting an MRI data acquisition scan of the portion of subject P within the imaged volume. The sequence controller 10 also typically transfers the incoming acquired NMR/MRI data to the computer system 20.

Here, the data acquisition sequence information refers to pieces of information defining a procedure for performing the scan, such as the intensity of electrical current supplied by the gradient magnetic-field power supplies 3 to the gradient magnetic-field coils, the relative time(s) at which the gradient coil currents is supplied, intensity of the RF signal transmitted from transmitter 7 via transmission coil 6 and the relative time(s) at which the RF signal is transmitted, the relative time(s) at which receiver 9 detects the NMR signal, and the like. In other words, the data acquisition sequence information determines how, when and from where NMR data is acquired and used to fill k-space with acquired data for eventual use in display image creation (e.g., by 2DFT and/or 3DFT).

The computer system 20 performs overall control of the MRI apparatus 100, collects data, reconstructs images, and the like. The computer system 20 can typically include interface unit 21, image reconstructing unit 22, storage unit 23, display unit 25, input unit 24, and controlling unit 26.

The interface unit 21 controls input and output of various signals exchanged between the computer system 20 and sequence controller 10. For example interface unit 21 transmits sequence information to sequence controller 10 and receives NMR signal data from sequence controller 10. Upon receiving NMR signal data, interface unit 21 stores the NMR signal data in storage unit 23.

Image reconstructing unit 22 performs post-processing, namely image reconstruction using processes such as multi-dimensional Fourier Transform, on the NMR signal data stored in storage unit 23. As a result, image reconstructing unit 22 generates a display image. Here, some further detail of the image reconstruction processing by reconstructing unit 22 of present exemplary embodiments is described hereinafter.

Storage unit 23 stores NMR signal data received by interface unit 21, image data generated by image reconstructing unit 22, and the like.

Input unit 24 receives various instructions and pieces of information input by an operator. Pointing devices such as a mouse and/or a track ball, and/or an input device such as a keyboard can be used accordingly as input unit 24. Input unit 24 provides user interfaces for receiving various operations to the operator of the MRI apparatus 100 by working with display unit 25.

Display unit 25 displays various pieces of information under control of controlling unit 26. A display device such as a liquid crystal display (LCD) device can be used as display unit 25.

Controlling unit 26 may include a central processing unit (CPU) (not shown), a memory, and the like to perform overall control of MRI apparatus 100. Specifically, the controlling unit 26 may generate the data acquisition sequence information based on imaging condition(s) input by the operator through input unit 24 and transmits generated data acquisition sequence information to sequence controller 10, thereby controlling scanning. Controlling unit 26 may also control reconstruction of an image based on NMR signal data sent from sequence controller 10 as a result of the data acquisition scan.

Here, controlling unit 26, as shown in FIG. 1, includes an imaging sequence information generation unit 26a which generates sequence information based on imaging condition (s) input by the operator through input unit 24. Sequence information generated by sequence information generation unit 26a in the present exemplary embodiment is described in some more detail hereinafter.

MRI apparatus 100 acquires NMR signals irradiated from subject P and reconstructs magnetic resonance images. Furthermore, MRI apparatus 100 acquires NMR signal based on the generated sequence information and thereby configures the apparatus to enable MRI with reduced motion-induced artifact while still enjoying relatively short image data acquisition times.

When the blade rotation data acquisition method is selected by operator input, sequence information generating unit 26a controls data acquisition according to one of the exemplary non-linear k-space data filling techniques described below. In addition, when using such blade rotation data acquisition methods, an imaging method such as FSE (Fast Spin Echo) can be used to permit multi shot sequences thus further shortening total image data acquisition time. The non-linear blade rotation data acquisition methods herein described acquire NMR signal data for filling into a non-Cartesian grid in k-space (e.g., by rotating a non-linear belt-like data acquisition sub-region about the origin in k-space).

Figure 2A:
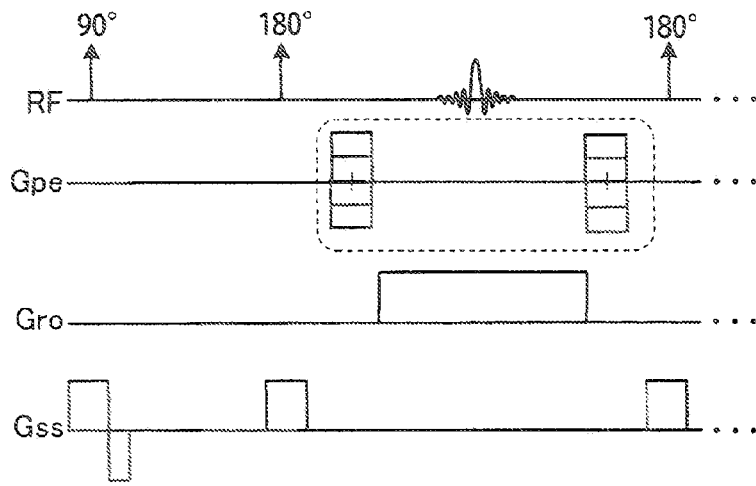
FIG. 2(A) and FIG. 2(B) are simplified schematic diagrams of portions of MRI data acquisition pulse sequences using conventional prior art blade rotation acquisition methods (executed using the FSE method).
Figure 2B:
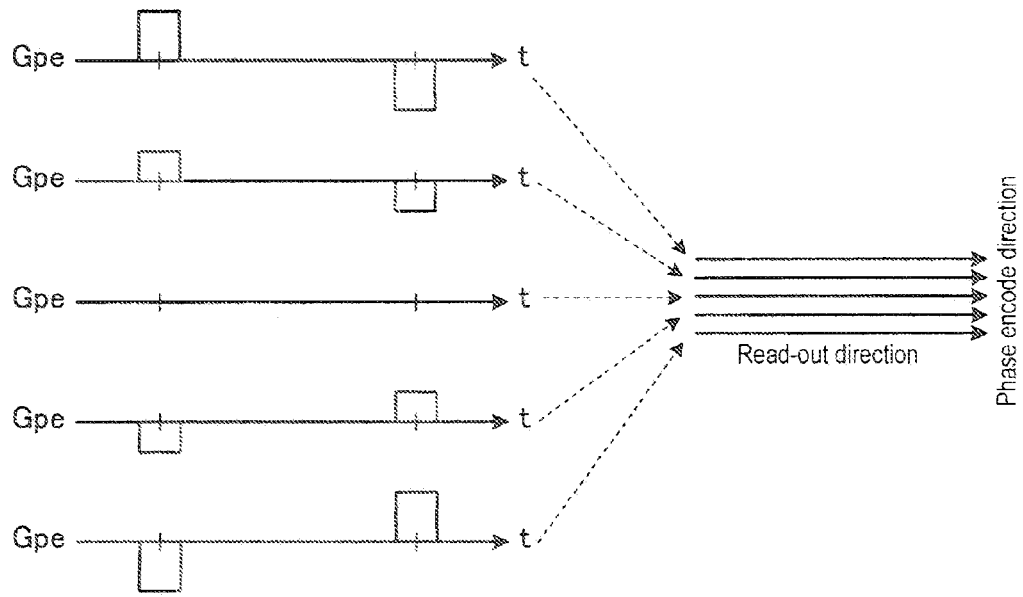
Figure 3:
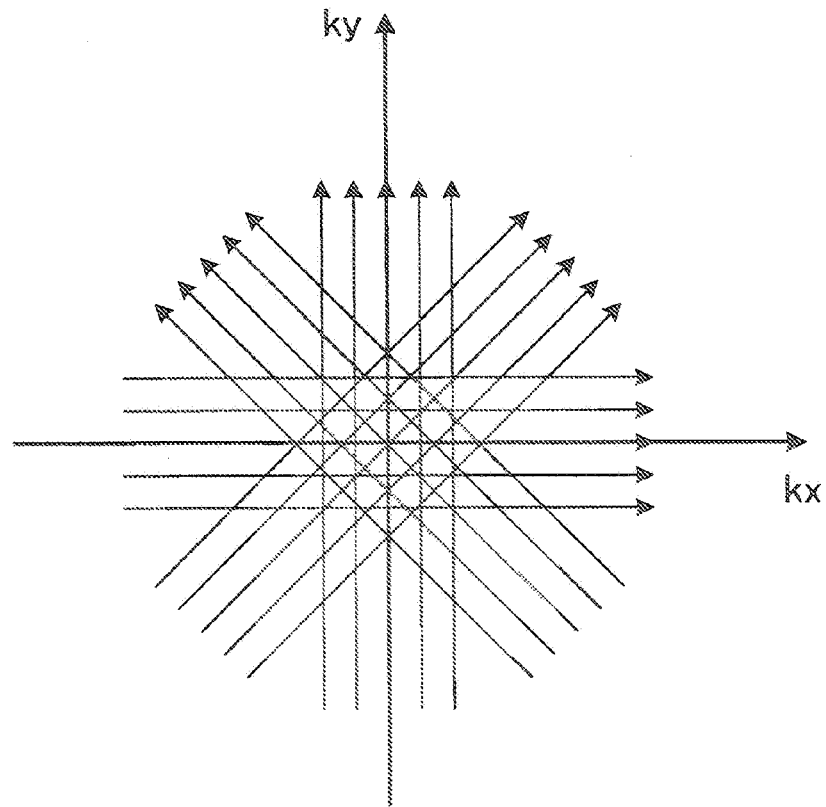
FIG. 3 is a simplified schematic diagram illustrating the conventional data filling pattern in k-space when the blade rotation acquisition method of FIGS. 2(A) and 2(B) is executed.

A conventional linear blade rotation data acquisition sequence (using FSE) is illustrated with reference to FIG. 2(A), FIG. 2(B) and FIG. 3. FIG. 2(A) and FIG. 2(B) are diagrams illustrating a typical FSE blade rotation sequence. FIG. 3 is a diagram illustrating the linear NMR data filling pattern in k-space corresponding to the FSE sequence of FIGS. 2(A) and 2(B).

On the RF pulse line, a timed sequence of echo refocusing pulses (normally 180 degree nutation pulses) is transmitted after the initial exciting nutation pulse (e.g., typically a 90 degree nutation pulse). The Transmitted RF nutation pulses are shown by upward arrows while the first NMR RF "echo" response is shown on the RF line by a characteristic sinc envelope depiction (echo signal) in FIG. 2(A).

Next depicted in FIG. 2(A) are the phase encode gradient magnet-field "Gpe" pulses. Opposite polarity Gpe gradient field pulses bracket the NMR RF spin echo response (the first pulse effecting a NMR signal phase shift which is then cancelled out after the NMR response by the second pulse). The integrated magnitude of such pulse pairs is adjusted to be different for successive spin echo responses thus effecting different phase encoding of the NMR RF responses as a function of spatial distance along the PE direction.

As also shown in FIG. 2(A), a frequency encoding read-out direction gradient magnetic field Gro is present during acquisition of the NMR spin echo RF response. As will be understood by those in the art, this process acquires data for populating a "line" of k-space data (with a constant phase encoded ordinate value in k-space corresponding to the magnitude of the integral of Gpe defining a line and with frequency encoded abscissa values along that line corresponding to the increasing magnitude of the integral of Gro during the data acquisition readout interval).

Since Gpe magnitude is changed for each 180 degree refocusing pulse, this effectively defines a "blade" data acquisition region having a plurality of parallel data acquisition loci. In addition, of course the slice-select gradient field Gss illustrated in FIG. 2(A) may be used during transmitted RF nutation pulses so as to selectively address nuclei having a Larmor frequency only within a slice volume that is to be imaged (plural parallel slices being also possible to image a more extensive three dimensional volume in the patient subject P).

For example, when a blade having five parallel Gpe data acquisition loci is effected, the Gpe integrated pulse magnitude must change between five different values. FIG. 2(A) actually illustrates superimposed sub-sequences to define five parallel data acquisition loci in k-space. As will be understood, NMR echo data is acquired for five different parallel lines along the read-out direction as the Gpe value is changed for successive sub-sequence times. As shown in FIG. 2(B), the read-out direction in this example is parallel to the longer side of the blade region while the phase encode direction is parallel to the shorter side of the blade region.

After NMR data is acquired for the entire blade region, the region is rotated around the origin of k-space (i.e., by changing the relative intensities of Gx and Gy gradient fields to define differently oriented vector sums to define the Gpe and Gro directions for a rotated new position of the blade region. As indicated in FIG. 3, NMR data may thus be acquired for a sequence of relatively rotated five-line blade areas in k-space.

Figure 19:
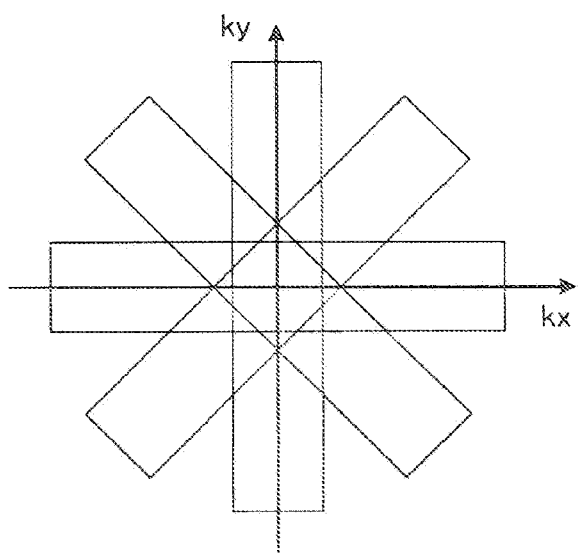
FIG. 19 is a simplified schematic diagram illustrating a typical prior art problem in only partially filling k-space with acquired NMR data when using the PROPELLER/BLADE type of data acquisition to compensate for motion artifact.
Figure 17:
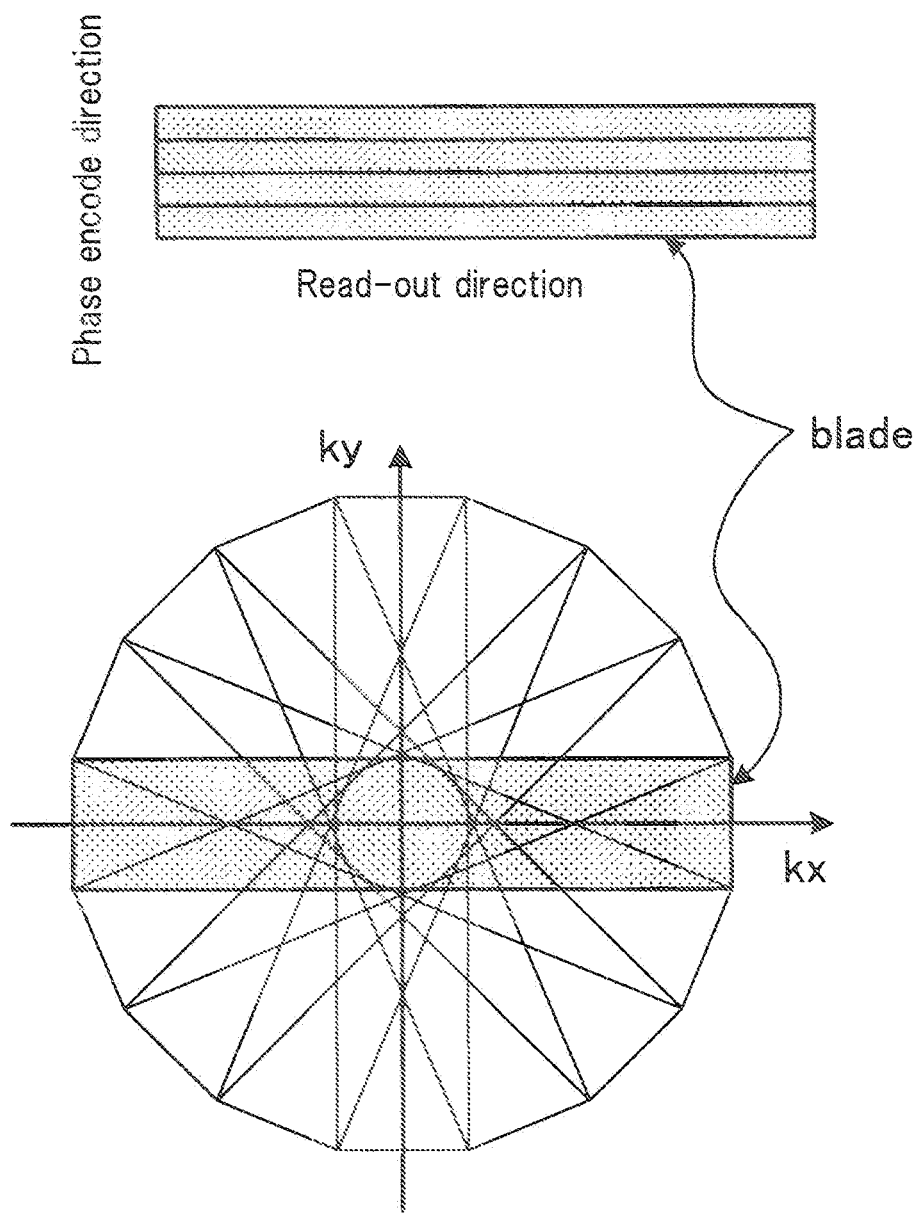
FIG. 17 is a simplified schematic diagram illustrating a first typical prior art PROPELLER/BLADE k-space filling pattern.
Figure 18:
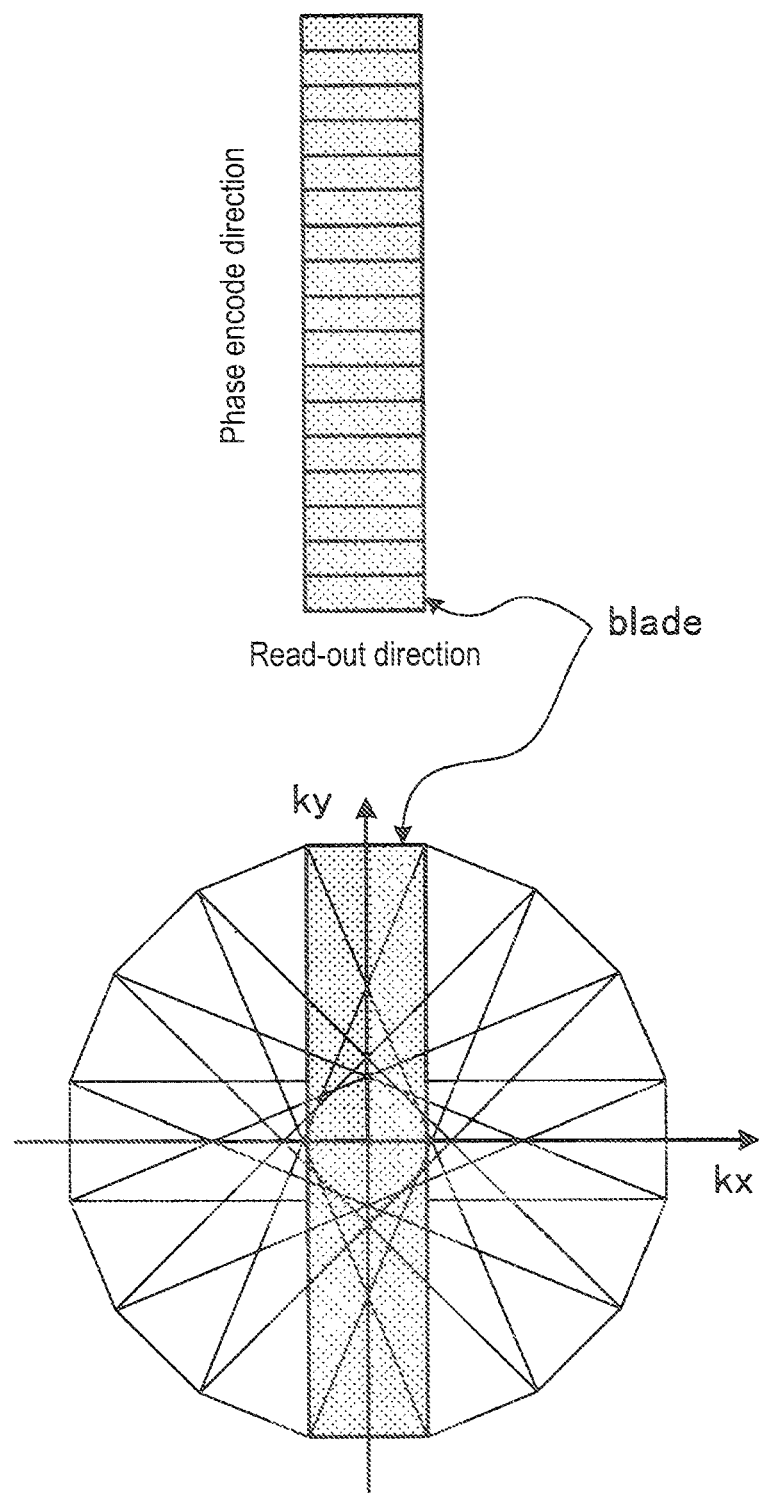
FIG. 18 is a simplified schematic diagram illustrating a second typical prior art PROPELLER/BLADE k-space filling pattern.

Unfortunately, if one attempts to completely fill k-space in this conventional manner (i.e., with no unfilled k-space cells), the required total data acquisition time can become quite long (i.e., because the blade regions overlap each other to provide redundant data in many areas, but still leave open areas at the periphery of k-space as shown in FIG. 19). If one attempts to decrease the number of RF pulse shots in each sub-sequence or reduce the number of blade regions to shorten imaging time, as shown in FIG. 19, empty spaces between blades are soon inevitable. Such unfilled empty portions of k-space can cause another type of image artifact (e.g., linear artifact).

Figure 4:
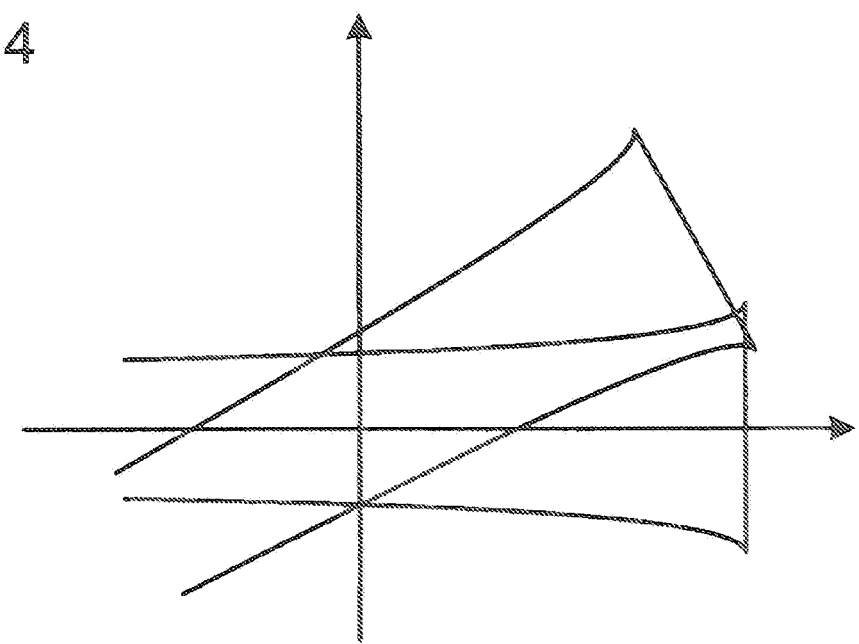
FIG. 4 is a simplified schematic diagram abstractly illustrating an exemplary non-linear k-space data filling sequence in accordance with a first exemplary embodiment.

Therefore, the sequence information generation unit 26a of the exemplary embodiments generate sequence information so that there is no (or at least reduced) empty space between the blade regions if operator inputs select a lower number of RF shots and/or a reduced number of blade regions to shorten total imaging time. FIG. 4 is a schematic abstract diagram illustrating one type of non-linear blade region that can be defined by sequence information generated by sequence information generating unit.

As shown in FIG. 4, the sequence information generation unit 26a generates sequence information which causes at least one dimension of the blade data acquisition region to become larger as distance from the origin in k-space increases (e.g., the width of the blade data acquisition region along the phase encode direction at at least some positions more distant from the origin of k-space is larger than the width at some positions nearer the origin of k-space). This is effected in the exemplary embodiments by making some or all of the Gpe defined loci in the blade region non-linear (for example, the readout loci defined by Gpe become curved at the beginning and/or ending of the readout time interval by adding controlled amounts of Gpe during the readout period). As can be seen in FIG. 4, the resulting blade data acquisition region is no longer rectilinear (e.g., rectangular). Instead, the blade region becomes wider towards an end remote from the origin. By use of such a non-linear blade region, empty space is better avoided between the blade regions even when steps are taken to reduce the number of RF shots and/or a reduced number of blade regions.

Figure 5A:
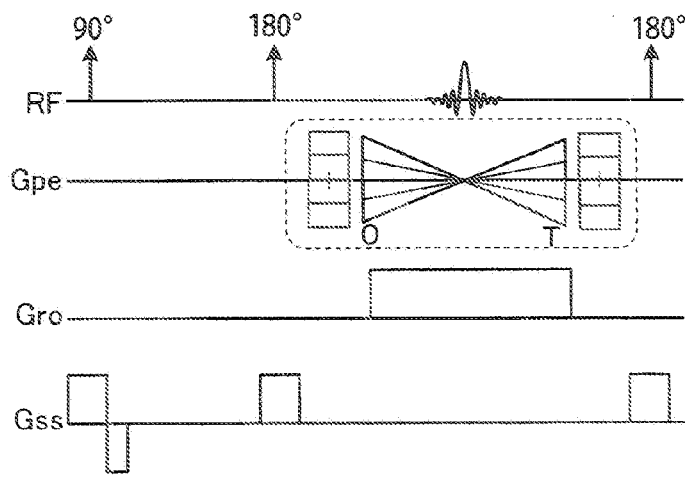
FIG. 5(A) and FIG. 5(B) are simplified schematic diagrams of portions of MRI data acquisition pulse sequences using the first exemplary embodiment with FSE data acquisition.
Figure 5B:
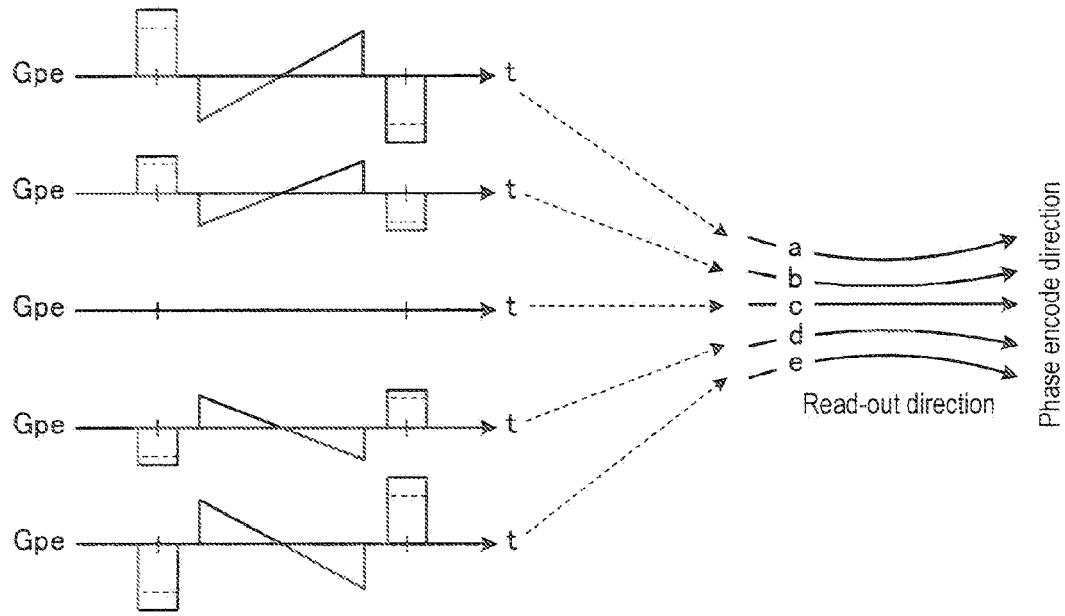

For example, the sequence information generation unit 26a can generate sequence information as shown in FIG. 5(A) and FIG. 5(B) which illustrate FSE sequence information for the first exemplary embodiment.

The sequence information generation unit 26a now inserts additional Gpe phase encode direction gradient magnetic field during data acquisition (e.g., compare FIG. 5(A) to FIG. 2(A)). Here data acquisition start time is defined as t=0 and the value of Gpe before t=0 is described as Gpe(0). Further, data acquisition finish time is defined as t=T and the value of Gpe after finish time is defined as Gpe(T). To keep a zero net integral value for Gpe, the sense of Gpe is of course oppositely directed on each side of the spin echo as shown in FIG. 5(A). For example, Gpe(0)=−Gpe(T).

The sequence information generation unit 26a may also set a stronger Gpe magnitude during at least part of at least one readout period so that a data acquisition start (or ending) point for a corresponding data acquisition locus positioned at the outside of the data acquisition blade area is effectively positioned further from center of the blade area than are loci nearer to the origin of k-space along that at least one phase encoded loci.

For example, when a conventional Gpe pulse (i.e., imposed before the Gro data acquisition period begins) is defined as Gpe(0), the added gradient at t=0, i.e., G(0), is set so that |G(0)|>|Gpe(0)| (wherein G(0) and Gpe(0) have same sense or sign). Similarly, when a conventional-Gpe pulse imposed after the data acquisition period is defined as Gpe(T), the ending value of the added gradient at t=T, i.e., G(T), is set so that |G(T)|>|Gpe(T)| (wherein G(T) and Gpe(T) also have the same sense or sign).

As shown in FIG. 5(A), the added G(t) gradient field in the phase encoding direction is imposed during the Gro readout gradient NMR signal acquisition period. The intensity of the added G(t) gradient field along the PE direction gradually changes and reverses in sense or sign as t progresses toward T. As will be appreciated, the Gpe gradient magnetic field is conventionally used for phase encoding. However, because the added Gpe gradient magnetic field is imposed while data acquisition is occurring, this now results in further frequency encoding. In other words, in this present exemplary embodiment, some frequency encoding can be considered to occur along the direction that is conventionally defined only as a phase encoding direction. Hereinafter, this added intra-readout gradient magnetic field along the PE direction will still be described as the phase encode direction gradient magnetic field. However, in reality, in this present exemplary embodiment, phase encode direction gradient magnetic field should not be considered as limited to only phase encoding.

The sequence information generation unit 26a generates sequence information which effects different intensity of Gpe pulses associated with each 180 degree refocusing pulse, just as the conventional FSE method does. Thus, in FIG. 5(A), five sub-sequences for five data acquisition loci within a given blade region are superimposed. However, in FIG. 5(B) each sub-sequence of Gpe direction gradient magnetic fields defining each of five different data acquisition loci is shown separately.

For example, the sequence information generation unit 26a generates sequence information that sets the absolute value of G(0) larger than Gpe(0) for data acquisition loci a, b, d, e shown in FIG. 5(B). Then, the end points of the data acquisition loci a, b, d, e spread apart more widely towards the loci ends than at positions nearer the origin of k-space as compared to locus c (which has no added Gpe gradient applied during the corresponding NMR data acquisition period).

Furthermore, the sequence information generation unit 26a, as shown in FIG. 5(B), generates sequence information that effects added phase encode direction gradient magnetic field having a gradually changing intensity (e.g., linearly from reversed sign towards the phase encode direction gradient magnetic field Gpe(0) imposed before the data acquisition period to the same sign as Gpe(0) during the Gro data acquisition period). Such added intra-readout period Gpe gradient magnetic field makes the data acquisition loci a, b, d, e to more widely separate again (in the PE direction) after getting closer together (e.g., in the area of the origin of k-space) as the data acquisition period progresses. In addition, the final data acquisition point, which is at a more separated loci position, is returned to the desired initial conditions by G(T). For the next data acquisition locus, the data acquisition point is returned by the 180 degree refocus RF pulse.

Figure 6:
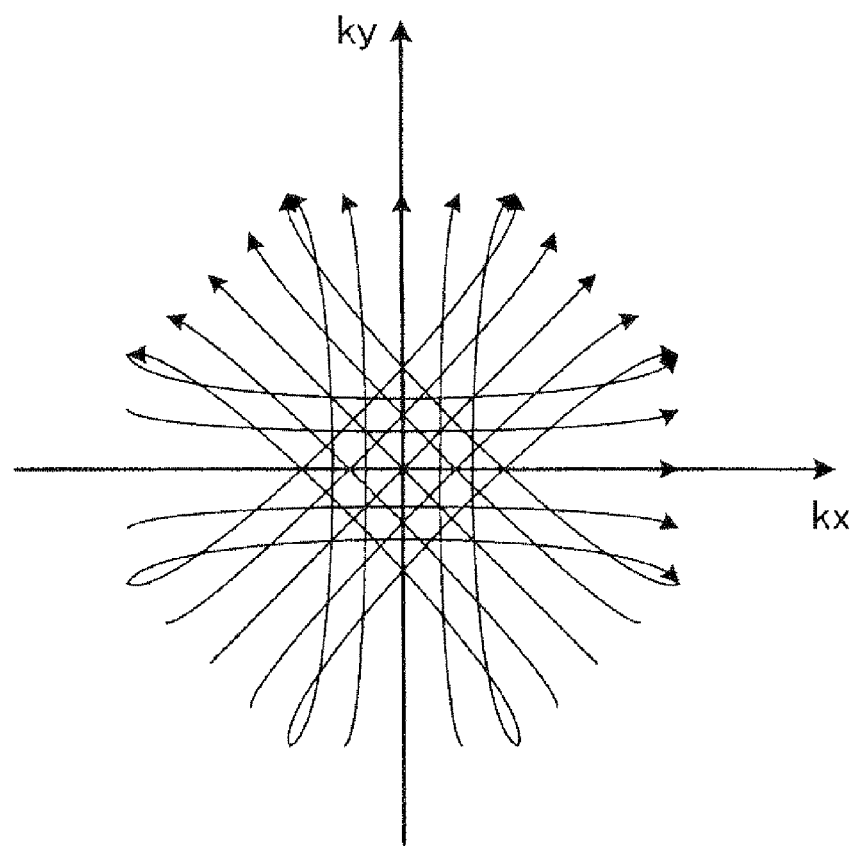
FIG. 6 is a simplified schematic diagram illustrating in more detail the exemplary non-linear k-space data filling sequence for the first exemplary embodiment.

Sequence information generated by sequence information generation unit 26a is transmitted via interface 21 to sequence controller 10. Sequence controller 10 scans the image volume within patient subject P by driving the gradient magnetic field power supplies 3, RF transmitter 7 and RF receiver 9. FIG. 6 is a schematic diagram illustrating an exemplary k-space data filling pattern effected by the exemplary sequence information which produces the pulse sequences illustrated in FIG. 5.

As shown in FIG. 6, acquired NMR data is filled into k-space using non-linear blade data acquisition regions that are shaped to become wider (in the phase-encode direction) near both ends of the acquisition loci. In addition to the magnetic field intensity of Gpe, the phase encode direction gradient magnetic field G(t) that is added during data acquisition may be automatically set by controller 10 or by manual operator control based on the needed non-linear adjustments to completely fill k-space for a particular choice of the number of blades and/or number of RF shots set as the desired imaging conditions.

Image reconstructing unit 22 shown in the FIG. 1 reconstructs magnetic resonance images from NMR signal data acquired by use of sequence information generated by the sequence information generation unit 26a. For example, reconstruction unit 22 may effect required phase corrections (e.g., such as correction for the time lag between acquiring data for the different data acquisition regions).

Acquired data may be effectively relocated (e.g., by interpolation, etc) into the conventional PROPELLER data acquisition loci shown in FIG. 3. If so, then image reconstruction unit 22 may convert data acquired along the exemplary non-linear data acquisition loci into data along the conventional Cartesian coordinate system in k-space that is used for normal MRI reconstruction. For example, to derive data for each conventional acquisition position along the usual k-space Cartesian coordinate system, reconstruction unit 22 may interpolate data thereinto from the non-linear data acquiring loci existing near the desired Cartesian coordinate position. In this present exemplary embodiment, because density of acquired data points becomes lower at areas further from the origin of k-space, reconstructing unit 22 may effect processes such that the farther the interpolation distance, the broader the area used for interpolation. More ideally, reconstructing unit 22 effects an interpolation process wherein the size of the areas used for interpolation changes as necessary so that each data point along the Cartesian coordinate system of k-space is based on same quantity of original acquired data points, regardless of distance from the origin of k-space.

To effect correction for motion artifact, reconstructing unit 22 converts phase corrected data for each blade data acquisition region into low-resolution images by Fourier Transformation. Reconstructing unit 22 then determines displacement between common image elements by comparisons between these low-resolution images that respectively correspond to blade data acquisition regions that have been acquired at different times.

Once such displacements are determined, reconstructing unit 22 corrects such misalignment between the low-resolution images (e.g., by rotation or parallel shift) based on the determined displacements. Furthermore, reconstructing unit 22 may execute weighting processes for data acquisition regions in order to remove (or reduce the influence of) data not properly correctable for motion artifact (e.g., by image rotation or parallel shift such as effects caused by non-rigid movements). As will be appreciated, reconstructing unit 22 thereafter converts the motion-corrected low-resolution images back to magnetic resonance signal data in k-space by inverse Fourier Transformation. Once back in k-space, reconstructing unit 22 may select and combine acquired NMR signal data to be used for final diagnostic image reconstruction (e.g., based on the motion corrected data and/or the added weighting data now possibly associated with various of the blade data acquisition regions) and then reconstructs final diagnostic magnetic resonance images by the usual multi-dimensional FT techniques.

Figure 7:
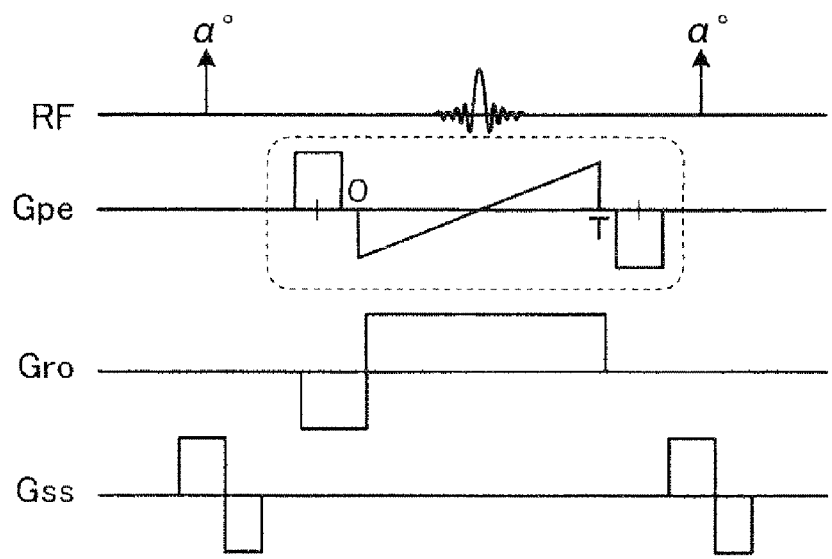
FIG. 7 is a simplified schematic diagram of a portion of a further MRI data acquisition pulse sequence for the first exemplary embodiment using a FE (field echo) NMR data acquisition method.
Figure 8:
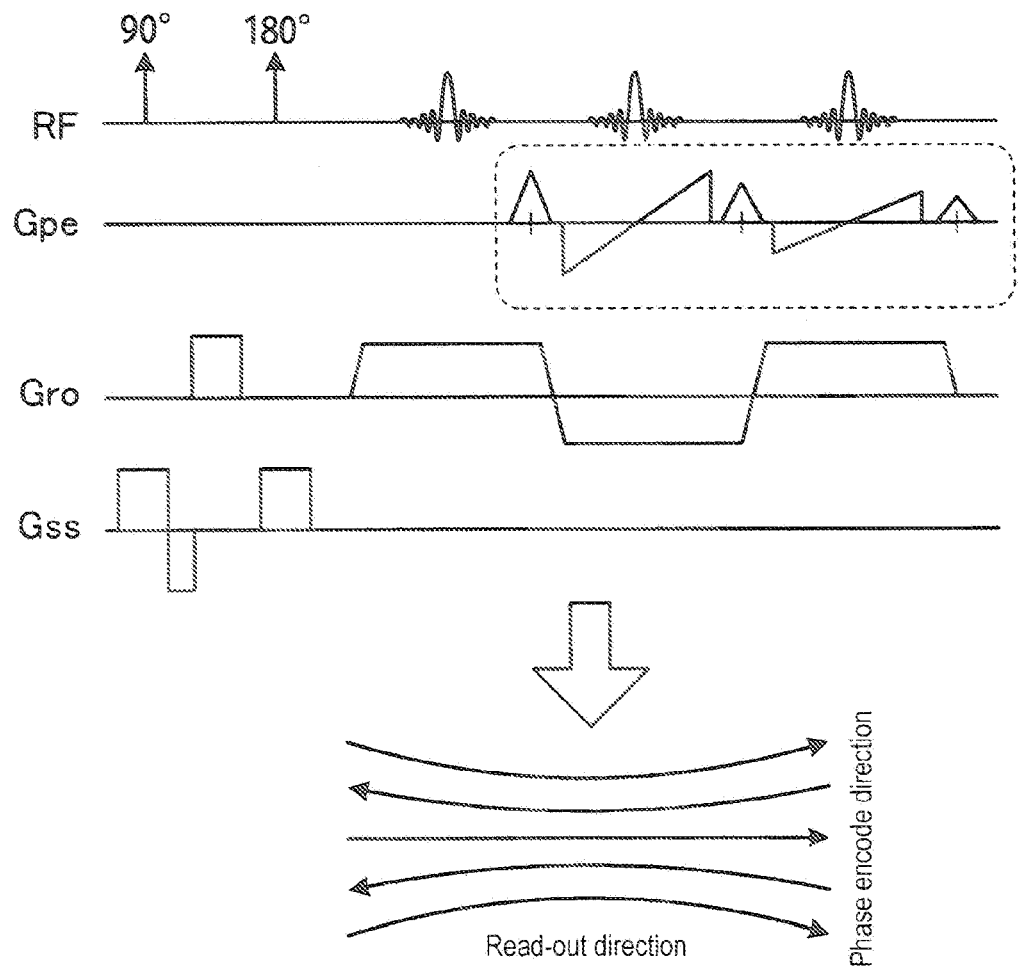
FIG. 8 is a simplified schematic diagram illustrating a portion of a further MRI data acquisition pulse sequence for the first exemplary embodiment using an EPI (echo planar imaging) NMR data acquisition method.
Figure 9:
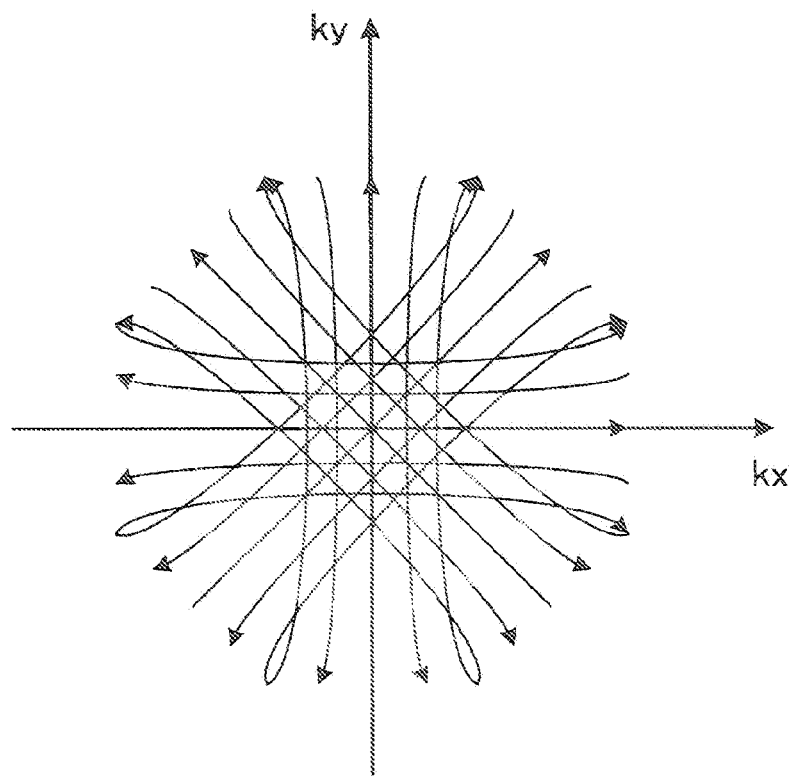
FIG. 9 is a simplified schematic diagram illustrating in more detail the exemplary non-linear k-space data filling sequence for the EPI data acquisition sequence depicted in FIG. 8.

It should be understood that the non-linear blade data acquisition regions also can be used with MRI techniques other than FSE. Other suitable MR imaging methods include FE (Field Echo) methods and EPI (Echo Planner Imaging) methods as described by reference to FIGS. 7-9. FIG. 7 is a diagram illustrating use of an exemplary FE method in the first exemplary embodiment. FIG. 8 illustrates use of an exemplary EPI method in the first exemplary embodiment. FIG. 9 illustrates a k-space data filling pattern for the EPI method illustrated in FIG. 8.

In an FE method, an RF echo signal is caused to occur after an initial RF nutation pulse by use of a sequence of successively reversed polarity read-out direction Gro gradient magnetic field pulses (i.e., instead of a sequence of 180 degree RF refocusing pulses). Reference may be had to Gro in FIG. 7.

Here, an FE method is used for acquiring data along non-linear acquisition loci which occupy blade regions having widened ends (in at least the phase encoding direction as distance from k-space origin increases). Sequence information generation unit 26a sets G(0) so that |G(0)|>|Gpe(0)| (wherein G(0) and Gpe(0) have the same sign). Also, the sequence information generation unit 26a sets G(T) so that |G(T)|>|Gpe(T)| (wherein G(T) and Gpe(T) have the same sign).

Furthermore, the sequence information generation unit 26a, as FIG. 7 shows, generates added PE direction gradient magnetic field with a gradually increasing intensity that starts out reversed in sign with respect to Gpe(0) but then changes to have the same sign as Gpe(0) as t=T. As mentioned above, a plurality of data acquisition loci are acquired by successively changing the intensity of Gpe pulses occurring before and after the FE. Then, as shown in FIG. 6, NMR data is filled into k-space within a blade data acquisition region that is shaped to become wider (in the PE direction) near both ends located away from the origin of k-space.

To use an EPI method, for quick acquisition of NMR signal data, a quickly changing polarity sequence of Gro pulses is used to create a back-and-forth sort of raster scan of a data acquisition region in k-space (refer to Gro in FIG. 8). The position of a final point of one data acquisition locus and the start point position of the next data acquisition locus are at the same read-out direction position.

Using an FE method, data may also be acquired for a non-linear blade region (e.g., having widened ends in at least the PE direction). Sequence information generation unit 26a sets G(0) so that |G(0)|>|Gpe(0)| (wherein G(0) and Gpe(0) have the same sign). Sequence information generation unit 26a, as FIG. 8 shows, generates sequence information for adding PE direction gradient magnetic field having an intensity gradually changing from a reversed sign (compared to the Gpe pulse) towards the same sign and magnitude as the initial Gpe phase encoding pulse imposed before the current data acquisition period.

Using the EPI method, for example, in a case where the non-linear blade data acquisition region is formed by five data acquisition loci, as shown in FIG. 8, the data acquisition loci are the same as the data acquisition loci shown in FIG. 5 except that the position of a final point of one data acquisition locus and the start point position of the next data acquisition locus have the same read-out direction position. By executing such sequence information as shown in FIG. 9, NMR data is filled into a k-space blade region that has a shape that becomes wider (in the PE direction) near both ends of the blade region.

Figure 10:
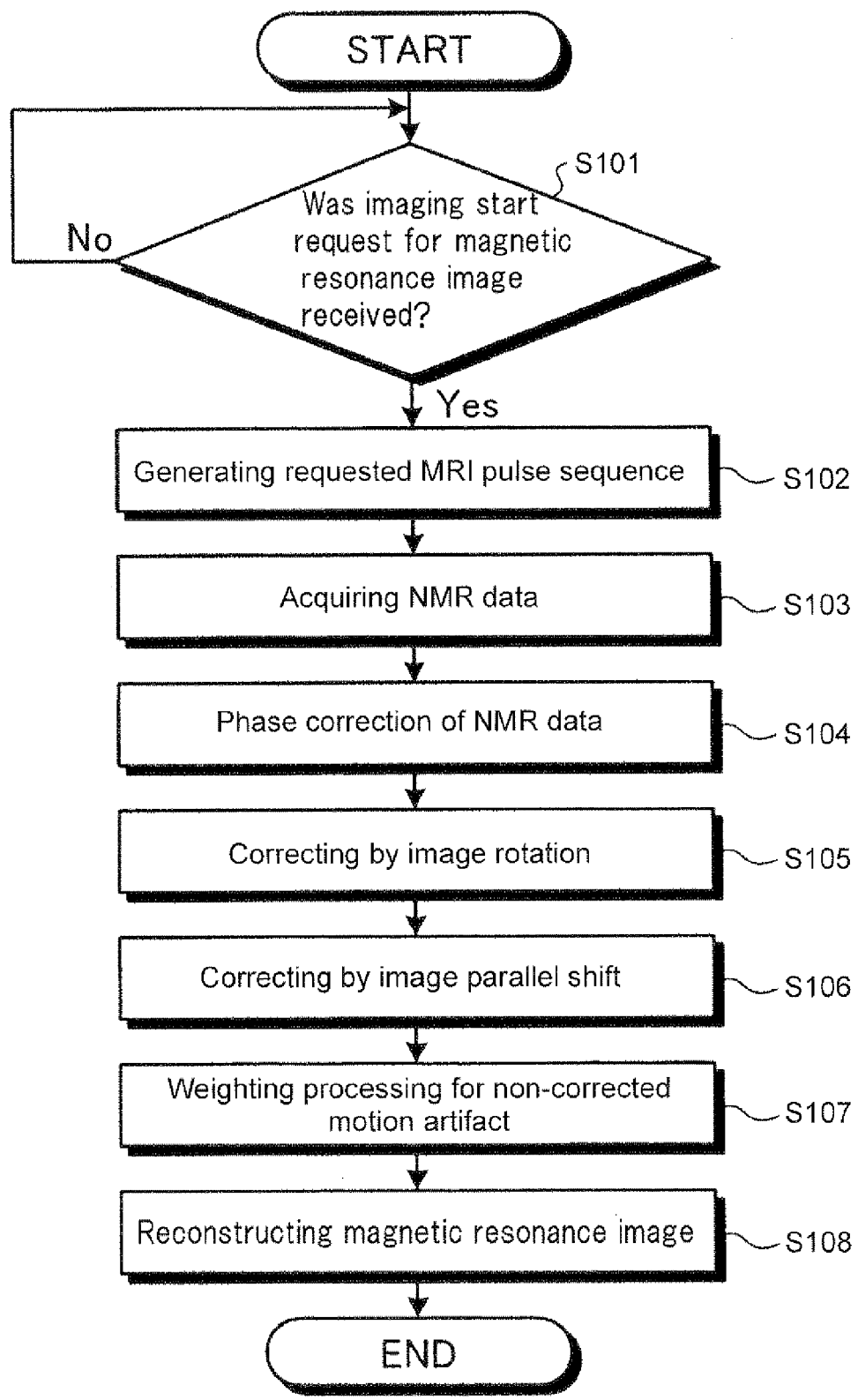
FIG. 10 is a simplified schematic flow chart of exemplary program logic for use by MRI apparatus of the first exemplary embodiment.

FIG. 10 illustrates exemplary flow chart representing computer logic code structure that can be used in the MRI apparatus 100 of the first exemplary embodiment.

As shown in FIG. 10, if MRI apparatus 100 receives an imaging condition and imaging start request via the operator input unit (step S101 Yes), the substantive processes of FIG. 10 begin. Specifically, when the MRI apparatus 100 receives a request for execution of a rotating blade imaging method (e.g., wherein NMR signal data is acquired within a rotating blade region formed by a plurality of data acquisition loci traversed at spaced time intervals), the MRI apparatus 100 initiates the following successive processing steps.

First, the sequence information generation unit 26a generates sequence information controlling the width of a non-linear blade data acquisition region. That is, at some positions distant from the origin of k-space, the width (in the PE direction) is wider than at some positions nearer the origin of k-space (Step S102). For example, when the FSE imaging method is selected in this context, sequence information generation unit 26a generates sequence information to effect a data acquisition sequence such as indicated in FIG. 5. If the FE imaging method is chosen in this context, sequence information generation unit 26a generates sequence information to effect a data acquisition sequence as indicated in FIG. 7. If EPI imaging method is chosen in this context, sequence information generation unit 26a generates sequence information to effect a data acquisition sequence as indicated in FIG. 8.

Sequence information generated by sequence information generation unit 26a is transmitted via interface unit 21 to sequence controller 10 which, in turn, drives gradient magnetic field power supplies 3, RF transmitter 7 and RF receiver 9—whereby receiver 9 acquires NMR signal data from a blade acquisition region having widened end shapes. (Step S103).

Reconstructing unit 22 then executes phase corrections (e.g., such as correction for the time lag between acquiring NMR data for each of the separate blade regions). (Step S104).

Reconstructing unit 22 next converts the phase corrected data for each blade data acquisition region into overlapping low-resolution images by Fourier Transformation and determines, if possible, displacement between images by comparison between such low-resolution images.

Next, reconstructing unit 22 corrects for detected image misalignments between the low-resolution images (e.g., by image rotation or parallel shift based on the determined displacement—see steps S105, S106). Furthermore, the exemplary reconstructing unit 22 also executes weighting processes for data acquisition regions (e.g., to effectively remove or reduce data not properly motion-artifact corrected by image rotation or parallel shift such as motion artifacts caused by movement of non-rigid tissues). See step S107. Reconstructing unit 22 thereafter converts the corrected low-resolution images back to NMR signal data in k-space by inverse Fourier Transform. The reconstructing unit 22 can then select from among available NMR signal data to be used for diagnostic image reconstruction (e.g., based on the weighting data that may have been added to each of the data acquisition regions) and then reconstructs final diagnostic magnetic resonance images by the usual Fourier Transformation techniques. See step S108.

In the present exemplary embodiments, the added PE direction gradient magnetic field during data acquisition changes linearly with respect to time. However, the change need not be linear. The PE direction gradient magnetic field added during the data acquisition interval may change according to any non-linear pattern such as quadratic curve. However, as understood by those in the art, it is of course preferable that the sum of integrated Gpe direction gradient magnetic fields applied over a data acquisition cycle be essentially "zero".

As mentioned above, in the first exemplary embodiment, the sequence information generation unit 26a generates sequence information causing the width (in the PE direction) of a blade data acquisition region to increase at some positions more distant from the origin of k-space as compared to the width at some positions nearer the origin of k-space.

Sequence information generation unit 26a sets the PE direction gradient magnetic field stronger so that at least a data acquisition start point of a data acquisition locus positioned at an outer side of the data acquisition area is located further from the center of the data acquisition region (in the PE direction) than points nearer the origin of k-space. Furthermore, the exemplary sequence information generation unit 26a generates sequence information that effects the added PE direction gradient magnetic field with an intensity that gradually changes from a relatively reversed sign (as compared to Gpe(0)). After that, reconstructing unit 22 reconstructs magnetic resonance image by using NMR signal data acquired using sequence information generated by the sequence information generation unit 26a.

Therefore, in the first exemplary embodiment, it is possible to avoid generating empty spaces between rotating blade data acquisition regions (even if the number of RF pulse shots is decreased and/or the number of rotating blade data acquisition regions is reduced). By completely filling k-space, it is possible to generate improved diagnostic magnetic resonance images (e.g., in which motion artifact attributed to movement of the subject is suppressed even for relatively short total imaging times).

Second Exemplary Embodiment

In explaining the first exemplary embodiment, it was assumed that sequence information is generated for the rotating blade data acquisition region having a symmetric shape with respect to the read-out direction. In the second exemplary embodiment, it now will be explained that sequence information is generated for the rotating blade data acquisition region which causes the region to have an asymmetric shape with respect to the read-out direction.

Figure 11:
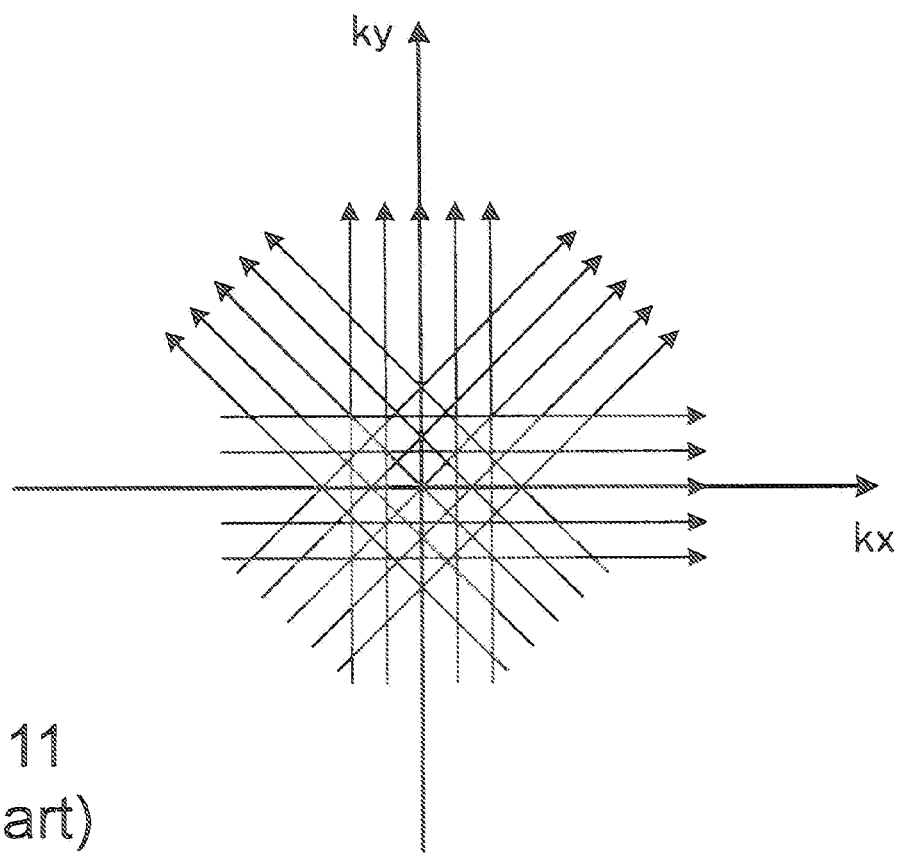
FIG. 11 is a simplified schematic diagram illustrating a typical prior art k-space data filling pattern where the blade shape is asymmetric (with respect to the origin of k-space) along the read out direction.

FIG. 11 is a diagram illustrating a prior art data filling pattern in k-space for the case where blade shape is asymmetric with respect to the read-out direction. By shortening echo time (TE) to obtain improved T1 contrast in the magnetic resonance image, for example, there is a case where NMR signal data is filled into a k-space region defined by an asymmetric blade where first half parts of loci are shortened along the read-out direction and second half parts of the loci are lengthened along the read-out direction as shown in FIG. 11.

In that case, if the number of RF pulse shots or the number of blades are reduced so as to shorten imaging time, empty spaces between blades are also inevitable.

Therefore, sequence information generation unit 26a of the second exemplary embodiment generates sequence information causing the width (in the PE direction) of one side of the blade data acquisition region to be become larger at some positions distant from the origin of k-space than the width at some positions nearer the origin of k-space. As with the first embodiment, although an example is given below using the FSE method, the second exemplary embodiment can also be similarly adapted for use with the FE or EPI methods.

Specifically, the sequence information generation unit 26a generates sequence information so that the widths of second half part of data acquisition region along phase encode direction at some positions distant from the original point of k-space are larger than the width at some positions near the original point of k-space.

Figure 12A:
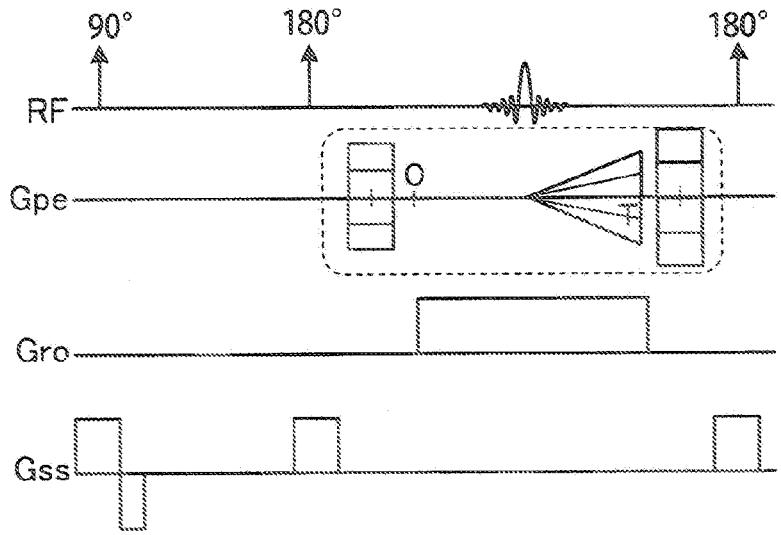
FIG. 12(A) and FIG. 12(B) are simplified schematic diagrams illustrating a portion of an MRI data acquisition pulse sequence for a second exemplary embodiment using the FSE (fast spin echo) method.
Figure 12B:
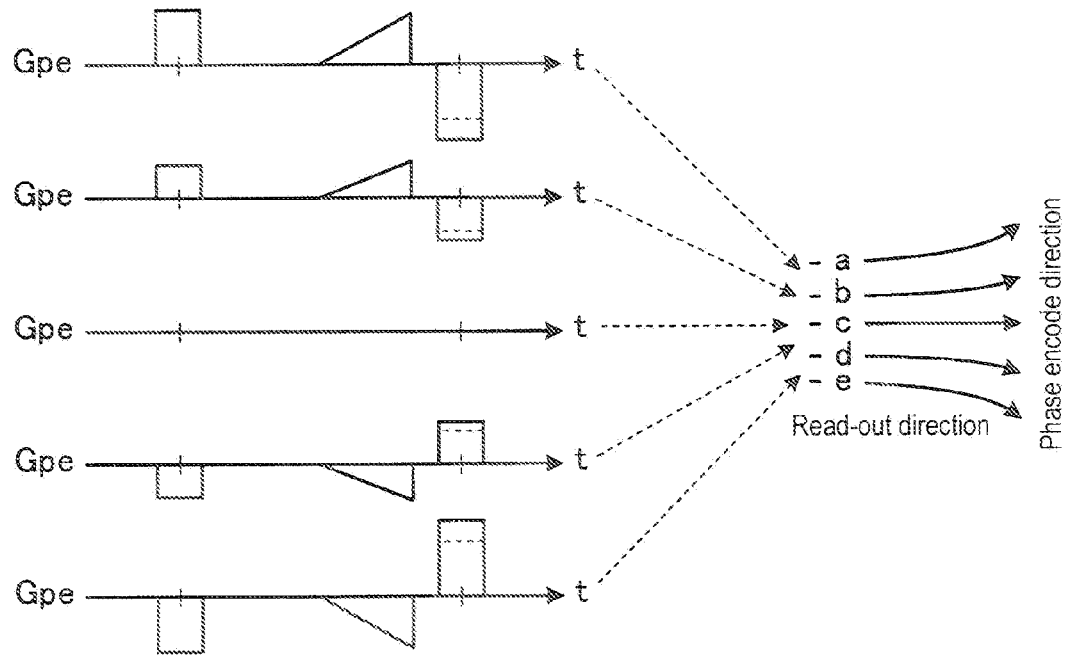

FIG. 12(A) and FIG. 12(B) are diagrams illustrating use of the FSE method in the second exemplary embodiment. Sequence information generation unit 26a of the second exemplary embodiment adds changing PE direction gradient magnetic field of unchanging polarity or sign during a Gro NMR data signal acquisition interval.

Sequence information generation unit 26a, so as to widen the blade width only at the second half of the locus in the read-out direction, sets the changing added PE direction gradient magnetic field (without changing its polarity) during NMR signal acquisition for at least a data acquisition locus positioned at the outer side of the data acquisition area. For example, the sequence information generation unit 26a of the second exemplary embodiment generates sequence information so that the intensity of the PE direction gradient magnetic field near the NMR spin echo center is zero and, after that but still during the data acquisition period, the absolute value of intensity of the added PE direction gradient magnetic field gradually increases as time progresses (but without changing polarity). Here, the sign of the added PE direction gradient magnetic field during the data acquisition period is the same as the sign of Gpe(0).

If only the width (in the PE direction) for the second half of a locus along the read-out direction is to be increased by the added PE direction gradient magnetic field during the data acquisition period, the sequence information is generated so that the value of G(0) is set to the same value as a conventional Gpe(0) and the absolute value of G(T) is set to be larger than Gpe(T), and of the same sign, for reversing the data acquisition position (which changes from a remote position in the phase encode direction, to a primary position). That is, G(T) is set so that |G(T)|>|Gpe(T)| (wherein G(T) and Gpe(T) have the same polarity or sign). Of course, as usual, it is preferred that the absolute integrated value the PE direction gradient magnetic fields sum to zero over a data acquisition cycle.

Sequence information generation unit 26a generates, as shown in FIG. 12(B), sequence information that adds the PE direction gradient magnetic field for data acquisition loci a, b, d, e having its intensity gradually changing linearly from zero to Gpe(0) during imposition of Gro during data acquisition. Furthermore, sequence information generation unit 26a, as shown in FIG. 12(B), generates sequence information that causes a larger absolute value of added G(T) for data acquisition loci a, b, d, e—but not locus c. Then, as shown in FIG. 12(B), the end of the second half of data acquisition loci a, b, d, and e spread more widely apart (in the PE direction) than at data acquisition positions nearer the origin of k-space.

Figure 13:
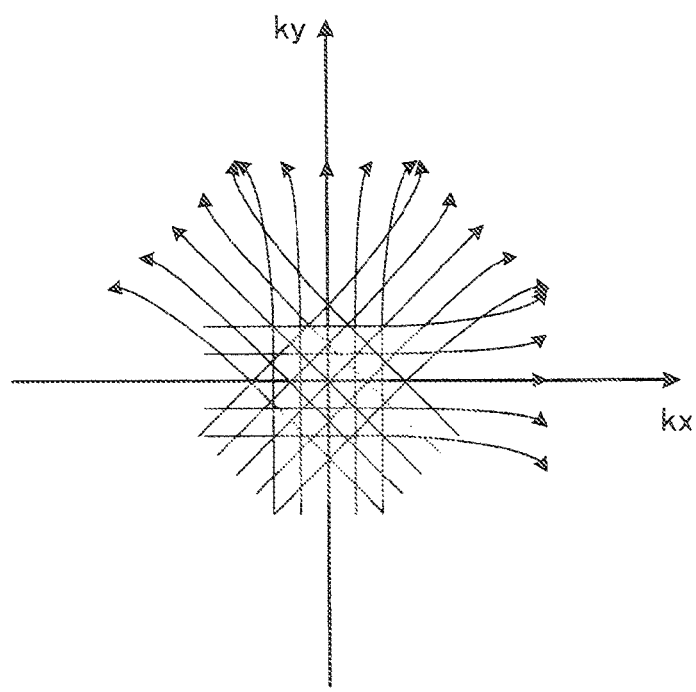
FIG. 13 is a simplified schematic diagram illustrating in more detail the exemplary non-linear k-space data filling sequence for the FSE data acquisition sequence depicted in FIG. 12.

As with the first exemplary embodiment, the sequence information generated by the sequence information generation unit 26a is transmitted via interface 21 to sequence controller 10 which, in turn, drives gradient magnetic field power supplies 3, RF transmitter 7 and RF receiver 8 and executes scan of the imaged volume within patient subject P. FIG. 13 is a diagram, illustrating a data filling pattern in k-space for sequence information as indicated in FIG. 12.

As shown in FIG. 13, only the second half of the data acquisition region is spread outwardly toward the ends and the NMR signal data is accordingly filled into k-space (e.g., by interpolation, etc as explained above for the first exemplary embodiment) at the wider ends of the asymmetrical data acquisition regions.

In the above mentioned example, NMR data is filled into k-space using an asymmetric data acquisition region wherein the first half of the region along the read-out direction is shorter and the second half along the read-out direction is longer. However, it is also adaptable to the case where NMR data is filled into k-space using an asymmetric data acquisition region where the first half of the region along the read-out direction is longer and the second half along the read-out direction is shorter.

For increasing the width (in the PE direction) only for the first half of a locus along the read-out direction, the sequence information generation unit 26a generates sequence information which sets the value of G(T) to that of a conventional phase encode direction gradient magnetic field Gpe(T) and sets the absolute value of G(0) to be larger than Gpe(0), with the same polarity or sign, for reversing the data acquisition position (i.e., changing that which becomes a remote position in the phase encode direction, to a new primary position). That is, G(0) is set so that |G(0)|>|Gpe(0)| (wherein G(0) and Gpe(0) have the same sign or polarity).

Next, the sequence information generation unit 26a of the second exemplary embodiment generates sequence information so that the intensity of the added PE direction gradient magnetic field right after the start of data acquisition is reversed in sign and having the intensity value of G(0) and, after that, the intensity of the added PE direction gradient magnetic field is gradually decreased to zero at a time point near the spin echo center in the time domain.

In this manner, only the first half of the data acquisition region is spread toward the end and the NMR signal data is filled into k-space (e.g., by interpolation methods) for the widened ends of the data acquisition regions.

The processing procedure of MRI apparatus 100 of the second exemplary embodiment is not different from that of the first exemplary embodiment except that the sequence information generated in Step S102 is sequence information as shown in FIG. 12.

In this second exemplary embodiment, the added PE direction gradient magnetic field during data acquisition changes linearly. However, that need not be the case. The added PE direction gradient magnetic field during data acquisition may change according to any non-linear pattern such as a quadratic curve.

Therefore, in the second exemplary embodiment, even when the shape of the data acquisition region is asymmetric (e.g., to improve T1 contrast in the diagnostic image) the number of RF pulse shots and/or the number of data acquisition regions is reduced, one can still avoid generating empty spaces in k-space between the rotating blade data acquisition regions. Therefore, in the second exemplary embodiment, it can be possible to generate diagnostic magnetic resonance images in which motion artifact attributed to movement of the subject is suppressed even for shorten total imaging times thus improving the image quality of diagnostic magnetic resonance images.

Third Exemplary Embodiment

Figure 14:
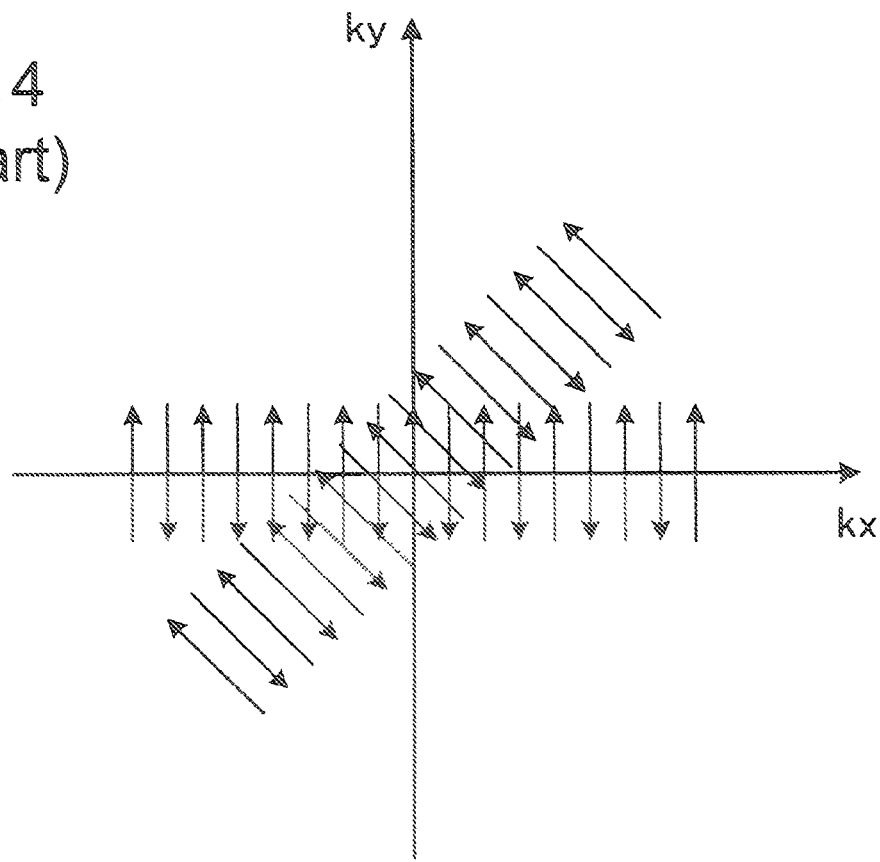
FIG. 14 is a simplified schematic diagram illustrating a typical prior art k-space data filling pattern for the Short Axis PROPELLER method.
Figure 15:
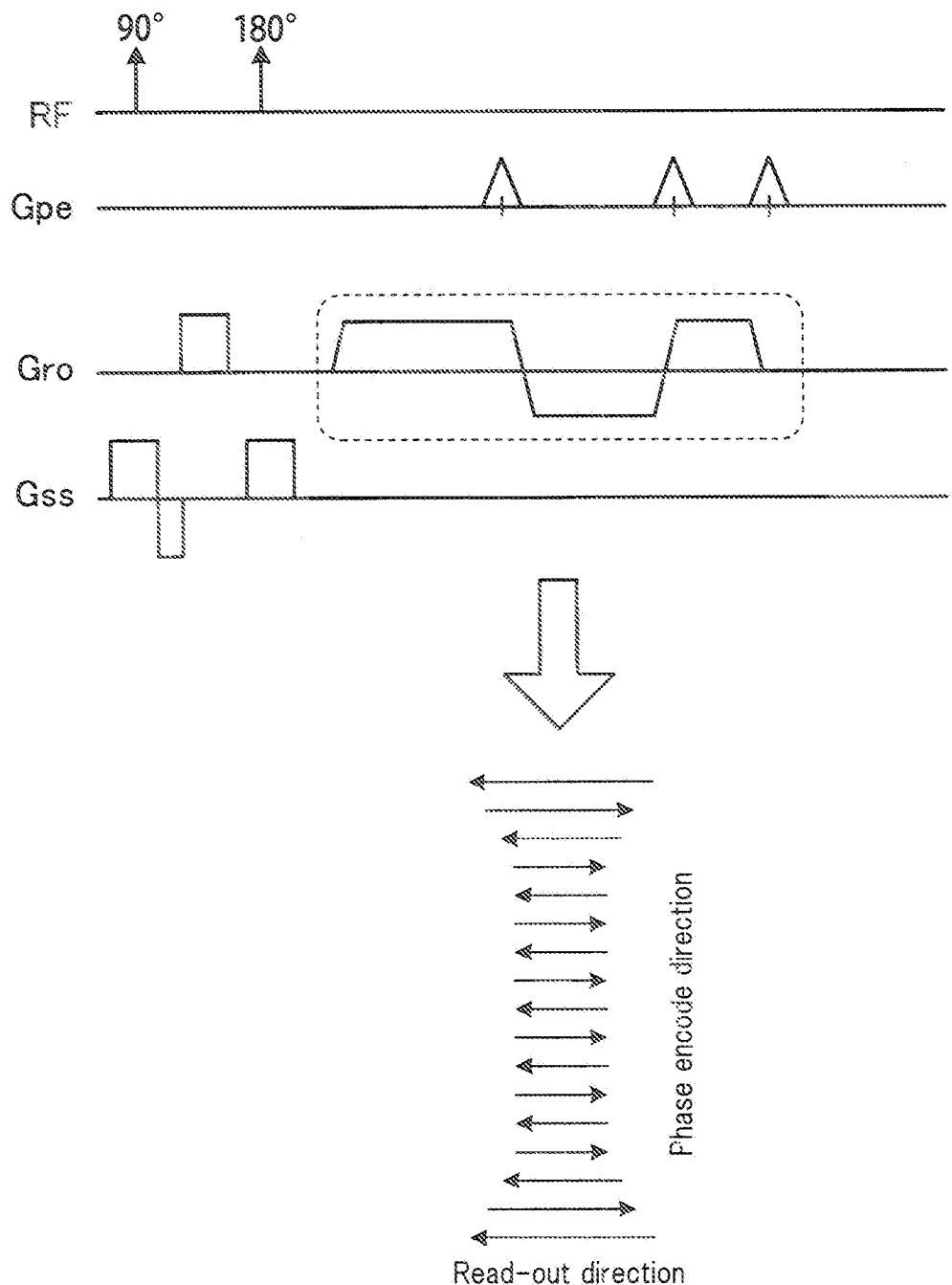
FIG. 15 is a simplified schematic diagram illustrating a portion of an MRI data acquisition pulse sequence (and k-space filling pattern) for a third exemplary embodiment.
Figure 16:
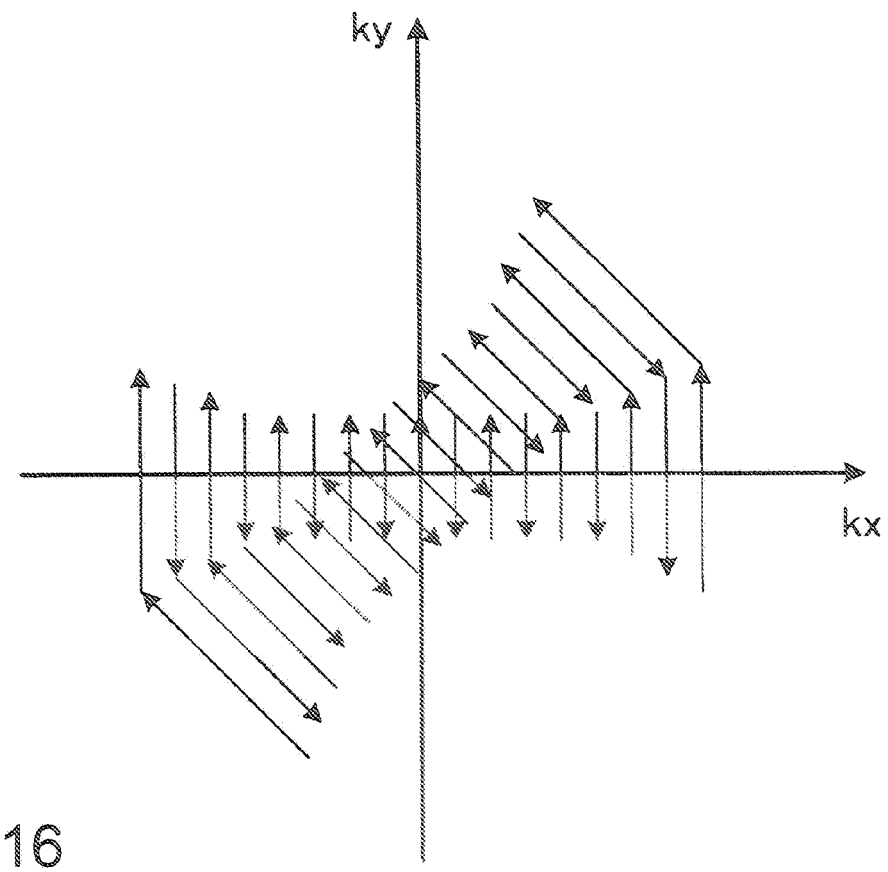
FIG. 16 is a simplified schematic diagram illustrating multiple short axis blade position k-space data filling pattern in accordance with the third exemplary embodiment.

In a third exemplary embodiment, a so-called Short Axis PROPELLER method is utilized. However, even here one can avoid generation of empty areas in k-space between the rotating blades. FIG. 14 is a diagram illustrating a prior art data filling pattern in k-space for the Short Axis PROPELLER method. FIG. 15 is a diagram illustrating sequence information for a third exemplary embodiment, and FIG. 16 is a diagram illustrating explaining a data filling pattern in k-space corresponding to the sequence information indicated in FIG. 15.

The Short Axis PROPELLER method may use the EPI method. As shown in FIG. 14, a short side of the blade region now corresponds to the read-out direction while the longer side of the blade region corresponds to the phase encode direction. NMR signal data is filled into k-space from the rotating blade region which is rotated between successive positions at repeated time intervals.

Such acquisition method may be executed to help suppress phase mismatching but if the number of blades is reduced so as to shorten total imaging time, empty areas in k-space between the blade regions is also generated.

Therefore, the sequence information generation unit 26a of the third exemplary embodiment, as shown in FIG. 15, generates sequence information that controls the intensity of the read-out direction gradient magnetic field so that the width of the read-out direction of the data acquisition region is gradually increased as distance from the origin of k-space increases.

That is, the sequence information generation unit 26a of the third exemplary embodiment, while quickly changing the polarity of successive read-out direction gradient magnetic field pulses at data acquisition, as shown in FIG. 15, make the area (time integral value of the magnetic field intensity) of read-out direction gradient magnetic field (Gro) variable. For example, the sequence information generation unit 26a generates sequence information so that added time duration for the read-out direction gradient magnetic field of data acquisition loci positioned at an outer area of the blade region is longer than for loci positioned nearer the center of the blade data acquisition region.

By such sequence information, as shown in FIG. 16, the width (in the read-out direction of the data acquisition region) becomes increased toward region ends and the NMR signal data is filled into k-space from such non-linear blade data acquisition regions.

The processing by MRI apparatus 100 of the third exemplary embodiment is not different from that of the first exemplary embodiment except that the sequence information generated in Step S102 is sequence information as shown in FIG. 15.

Therefore, in the third exemplary embodiment, even when the number of RF pulse shots and/or the number of data acquisition regions is decreased, even using the Short Axis PROPELLER method, one can still avoid generating empty areas in k-space between the rotating blade data acquisition regions. Moreover, in the third exemplary embodiment, because the echo interval near the center of k-space remains relatively shortened, phase mismatch can be suppressed. Therefore the third exemplary embodiment makes it possible to generate magnetic resonance images in which phase mismatch and motion artifact attributed to movement of the patient subject is suppressed even for short total imaging times.

The components of each device shown in the drawings are conceptual for describing functions, and not necessarily to be physically configured as shown in the drawings. In other words, forms of distribution and integration of the units are not limited to those shown in the drawings, and all or part of the units can be configured to be functionally or physically distributed and integrated in an arbitrary unit depending on various loads and conditions in use. Furthermore, all or an arbitrary part of processing functions performed by the respective units can be implemented by one or more Central Processing Units (CPU) and one or more computer program modules to be executed by the CPU(s), or the system can be implemented in whole or in part as special purpose hardware using wired logic.

While certain exemplary embodiments have been described, these embodiments have been presented by way of example only, and are not intended to limit the scope of the inventions defined by the appended claims. Indeed, the novel methods and systems described herein may be embodied in a variety of other forms; furthermore, various omissions, substitutions and changes in form of the methods and systems described herein may be made by those skilled in the art without departing from the teachings herein. The accompanying claims and their equivalents are intended to cover such forms or modifications as would fall within the scope and spirit of the above description.

What is claimed is:

1. A magnetic resonance imaging (MRI) apparatus configured to acquire nuclear magnetic resonance (NMR) signal data for a periodically rotated data acquisition region in k-space that includes a plurality of data acquisition loci therewithin, said apparatus comprising:

a data acquisition controller configured to acquire NMR signal data for a periodically rotated data acquisition region in k-space that includes a plurality of data acquisition loci therewithin defined by phase-encoding magnetic gradient pulses and read-out magnetic gradient pulses having orthogonal resultant directions which change for different rotational orientations of the region, said loci defining data acquisition regions having a width dimension that is larger at a point disposed further away from k-space origin than the width dimension of said region at a point nearer the origin of k-space thereby reducing or avoiding gaps in the coverage of k-space with acquired NMR data between different rotated positions of the data acquisition region; and an image reconstruction unit configured to reconstruct an image based on said acquired NMR signal data in k-space.

2. The magnetic resonance imaging apparatus according to claim 1, wherein the data acquisition controller is further configured:

to control the data acquisition region along a read-out direction to be longer than along a phase encode direction, and to control intensity of an added gradient magnetic field in the phase encoding direction during an NMR signal data acquisition interval for at least one of the plural data acquisition loci positioned toward an outer side of the data acquisition region so that the intensity varies from having a polarity opposite that of a phase encode gradient magnetic field pulse applied before the data acquisition interval to having the same polarity as the phase encode gradient magnetic field pulse applied before the data acquisition interval.

3. The magnetic resonance imaging apparatus according to claim 1, wherein the data acquisition controller is further configured:

to set intensity of an added phase encode direction gradient magnetic field applied during an NMR signal data acquisition interval to cause at least an end point of a data acquisition locus positioned toward an outer side of the data acquisition region to be positioned further in the phase encode direction from center of the data acquisition region than at points on the data acquisition locus nearer the origin of k-space.

4. The magnetic resonance imaging apparatus according to claim 1, wherein the data acquisition controller is further configured:

to add a time-varying phase encode direction gradient magnetic field while acquiring NMR signal data along at least one of the plurality of data acquisition loci positioned towards an outer side of the data acquisition region, the shape of the data acquisition region being asymmetric with respect to the read-out direction.

5. The magnetic resonance imaging apparatus according to claim 1, wherein the data acquisition controller is further configured:

to make the width of the data acquisition region along the read-out direction to be narrower than along the phase encode direction, and to make the length of at least one phase encode direction data acquisition locus positioned towards an outer area of the data acquisition region to be longer than a data acquisition locus positioned nearer the origin of k-space.

6. The magnetic resonance imaging apparatus according to claim 1, wherein the reconstruction unit is further configured:

to convert acquired NMR data on non-linear data acquisition loci in k-space into NMR data on k-space Cartesian coordinate loci based on interpolation of acquired NMR data at a plurality of points on data acquisition loci in an interpolation region near each point on the Cartesian coordinate loci, the interpolation region at a first point relatively closer to the origin of k-space being smaller than the interpolation region at a second point which is relatively farther from the origin of k-space.

7. A magnetic resonance imaging (MRI) method acquiring nuclear magnetic resonance (NMR) signal data for a periodically rotated data acquisition region in k-space that includes a plurality of data acquisition loci therewithin, said method comprising:

acquiring NMR signal data for a periodically rotated data acquisition region in k-space that includes a plurality of data acquisition loci therewithin defined by phase-encoding magnetic gradient pulses and read-out magnetic gradient pulses having orthogonal resultant directions which change for different rotational orientations of the region, said loci defining data acquisition regions having a width dimension that is larger at a point disposed further away from k-space origin than the width dimension of said region at a point nearer the origin of k-space thereby reducing or avoiding gaps in the coverage of k-space with acquired NMR data between different rotated positions of the data acquisition region; and reconstructing a magnetic resonance image based on said acquired NMR signal data in k-space.

8. The magnetic resonance imaging method according to claim 7 further comprising:

controlling the data acquisition region along a read-out direction to be longer than along a phase encode direction; and controlling the intensity of an added gradient magnetic field in the phase encoding direction during an NMR signal data acquisition interval for at least one of the plural data acquisition loci positioned toward an outer side of the data acquisition region so that the intensity varies from having a polarity opposite that of a phase encode gradient magnetic field pulse applied before the data acquisition interval to having the same polarity as the phase encode gradient magnetic field pulse applied before the data acquisition interval.

9. The magnetic resonance imaging method according to claim 7 further comprising:

setting intensity of an added phase encode direction gradient magnetic field applied during an NMR signal data acquisition interval to cause at least an end point of a data acquisition locus positioned toward an outer side of the data acquisition region to be positioned further in the phase encode direction from center of the data acquisition region than at points on the data acquisition locus nearer the origin of k-space.

10. The magnetic resonance imaging method according to claim 7 further comprising:

adding a time-varying phase encode direction gradient magnetic field while acquiring NMR signal data along at least one of the plurality of data acquisition loci positioned towards an outer side of the data acquisition region, the shape of the data acquisition region being asymmetric with respect to the read-out direction.

11. The magnetic resonance imaging method according to claim 7 further comprising:
controlling width of the data acquisition region along the read-out direction to be narrower than along the phase encode direction; and
controlling the length of at least one phase encode direction data acquisition locus positioned towards an outer area of the data acquisition region to be longer than a data acquisition locus positioned nearer the origin of k-space.

12. The magnetic resonance imaging method according to claim 7 further comprising:
converting acquired NMR data on non-linear data acquisition loci in k-space into NMR data on k-space Cartesian coordinate loci based on interpolation of acquired NMR data at a plurality of points on data acquisition loci in an interpolation region near each point on the Cartesian coordinate loci,
the interpolation region for a first point relatively closer to the origin of k-space being smaller than the interpolation region at a second point which is relatively farther from the origin of k-space.

13. A magnetic resonance imaging (MRI) method acquiring nuclear magnetic resonance (NMR) signal data for a periodically rotated data acquisition region in k-space that includes a plurality of data acquisition loci therewithin, said method comprising:
acquiring NMR signal data for a periodically rotated data acquisition region in k-space which has a plurality of non-linear NMR data acquisition loci that includes a plurality of data acquisition loci therewithin defined by phase-encoding magnetic gradient pulses and read-out magnetic gradient pulses having orthogonal resultant directions which change for different rotational orientations of the region,
said loci defining data acquisition regions having a shape which reduces or avoids gaps in the coverage of k-space with acquired NMR data between different rotated positions of the data acquisition region; and
reconstructing a magnetic resonance image based on said acquired NMR signal data in k-space.

14. The magnetic resonance imaging method according to claim 13 wherein:
the data acquisition region along a read-out direction is longer than along a phase encode direction and wherein a gradient magnetic field in the phase encoding direction having time-varying intensity and polarity is imposed during an NMR signal data acquisition interval.

15. The magnetic resonance imaging method according to claim 13 wherein:
a gradient magnetic field in the phase encoding direction having time-varying intensity and polarity is imposed during an NMR signal data acquisition interval.

16. The magnetic resonance imaging method according to claim 13 wherein:
a gradient magnetic field in the phase encoding direction having time-varying intensity but unchanging polarity is imposed during an NMR signal data acquisition interval.

17. The magnetic resonance imaging method according to claim 13 wherein:
the data acquisition region width along read-out direction is narrower than along phase encode direction and the length of at least one phase encode direction data acquisition locus positioned towards an outer area of the data acquisition region is longer than a data acquisition locus positioned nearer the origin of k-space.

18. The magnetic resonance imaging method according to claim 13 wherein:
acquired NMR data on non-linear data acquisition loci in k-space is interpolated into k-space Cartesian coordinate loci based on a plurality of points in an interpolation region near each NMR data point on the Cartesian coordinate loci,
the interpolation region for points relatively closer to the origin of k-space being smaller than the interpolation region for points relatively farther from the origin of k-space.

19. A magnetic resonance imaging (MRI) system configured to acquire nuclear magnetic resonance (NMR) signal data for a periodically rotated data acquisition region in k-space that includes a plurality of data acquisition loci therewithin, said system comprising:
an MRI sequence controller configured to acquire NMR signal data for a periodically rotated data acquisition region in k-space which has a plurality of non-linear NMR data acquisition loci that includes a plurality of data acquisition loci therewithin defined by phase-encoding magnetic gradient pulses and read-out magnetic gradient pulses having orthogonal resultant directions which change for different rotational orientations of the region,
said loci defining a data acquisition region having a shape which reduces or avoids gaps in the coverage of k-space with acquired NMR data between different rotated positions of the data acquisition region; and
an MRI image reconstruction unit configured to reconstruct a magnetic resonance image based on said acquired NMR signal data in k-space.

20. The magnetic resonance imaging system according to claim 19 wherein:
the data acquisition region along a read-out direction is longer than along a phase encode direction and wherein a gradient magnetic field in the phase encoding direction having time-varying intensity and polarity is imposed during an NMR signal data acquisition interval.

21. The magnetic resonance imaging system according to claim 19 wherein:
a gradient magnetic field in the phase encoding direction having time-varying intensity and polarity is imposed during an NMR signal data acquisition interval.

22. The magnetic resonance imaging system according to claim 19 wherein:
a gradient magnetic field in the phase encoding direction having time-varying intensity but unchanging polarity is imposed during an NMR signal data acquisition interval.

23. The magnetic resonance imaging system according to claim 19 wherein:
the data acquisition region width along read-out direction is narrower than along phase encode direction and the length of at least one phase encode direction data acquisition locus positioned towards an outer area of the data acquisition region is longer than a data acquisition locus positioned nearer the origin of k-space.

24. The magnetic resonance imaging system according to claim 19 wherein:
acquired NMR data on non-linear data acquisition loci in k-space is interpolated into k-space Cartesian coordinate loci based on a plurality of points in an interpolation region near each NMR data point on the Cartesian coordinate loci,
the interpolation region for points relatively closer to the origin of k-space being smaller than the interpolation region for points relatively farther from the origin of k-space.

* * * * *